(12) United States Patent
Kim et al.

(10) Patent No.: US 10,770,007 B2
(45) Date of Patent: Sep. 8, 2020

(54) DRIVING CIRCUIT FOR REAL-TIME EXTERNAL COMPENSATION AND ELECTROLUMINESCENT DISPLAY INCLUDING THE SAME

(71) Applicant: LG DISPLAY CO., LTD., Seoul (KR)

(72) Inventors: Byungil Kim, Gimpo-si (KR); Changho An, Hwaseong-si (KR)

(73) Assignee: LG DISPLAY CO., LTD., Seoul (KR)

( * ) Notice: Subject to any disclaimer, the term of this patent is extended or adjusted under 35 U.S.C. 154(b) by 218 days.

(21) Appl. No.: 15/803,325

(22) Filed: Nov. 3, 2017

(65) Prior Publication Data
US 2018/0130423 A1    May 10, 2018

(30) Foreign Application Priority Data

Nov. 4, 2016 (KR) .................. 10-2016-0146820

(51) Int. Cl.
*G09G 3/3291* (2016.01)
*G09G 3/3233* (2016.01)
(Continued)

(52) U.S. Cl.
CPC ............ *G09G 3/3291* (2013.01); *G09G 3/14* (2013.01); *G09G 3/2018* (2013.01); *G09G 3/3233* (2013.01); *G09G 3/3258* (2013.01); *H01L 27/3258* (2013.01); *H01L 27/3262* (2013.01); *H01L 51/5012* (2013.01); *H01L 51/5068* (2013.01); *H01L 51/5072* (2013.01); *G09G 2300/0426* (2013.01); *G09G 2310/0243* (2013.01); *G09G 2310/0294* (2013.01); *G09G 2320/0693* (2013.01)

(58) Field of Classification Search
CPC ...... G09G 3/14; G09G 3/2018; G09G 3/3233; G09G 3/3258; G09G 3/3291; G09G 2300/0426; G09G 2310/0243; G09G 2310/0294; G09G 2320/0693; H01L 27/3262; H01L 27/3258; H01L 51/5012; H01L 51/5068; H01L 51/5072
See application file for complete search history.

(56) References Cited

U.S. PATENT DOCUMENTS

| | | | |
|---|---|---|---|
| 10,217,390 B2 * | 2/2019 | Gupta | G09G 3/3233 |
| 2007/0252789 A1 * | 11/2007 | Kim | G09G 3/3216 345/76 |

(Continued)

*Primary Examiner* — Alexander Eisen
*Assistant Examiner* — Nathaniel P Brittingham
(74) *Attorney, Agent, or Firm* — Seed IP Law Group LLP

(57) ABSTRACT

A driving circuit for real-time external compensation and an electroluminescent display including the same are disclosed. The driving circuit includes a timing controller generating a gate shift clock group, a gate start pulse, and first and second selection signals and a gate driver generating a gate signal based on the control of the timing controller and supplying the gate signal to a display panel. The gate driver includes a plurality of stages which shifts the gate start pulse in accordance with the gate shift clock group to generate an output signal and supplies the output signal to a first output node, a first output control switch connected between a second output node connected to a gate line of the display panel and the first output node, and a second output control switch connected between the second output node and an input terminal of a gate low voltage.

20 Claims, 21 Drawing Sheets

(51) Int. Cl.
*G09G 3/14* (2006.01)
*G09G 3/20* (2006.01)
*G09G 3/3258* (2016.01)
*H01L 27/32* (2006.01)
*H01L 51/50* (2006.01)

(56) References Cited

U.S. PATENT DOCUMENTS

| | | | | |
|---|---|---|---|---|
| 2009/0167739 A1* | 7/2009 | Tsubata | ............... | G09G 3/3659 345/208 |
| 2014/0035890 A1* | 2/2014 | Jinta | ............... | G09G 3/20 345/204 |
| 2015/0194121 A1* | 7/2015 | Lee | ............... | G09G 3/3266 345/212 |
| 2015/0269900 A1* | 9/2015 | Iwamoto | ............... | G09G 3/3648 345/100 |
| 2016/0049131 A1* | 2/2016 | Wang | ............... | G09G 3/3648 345/206 |
| 2016/0125796 A1* | 5/2016 | Ohara | ............... | G09G 3/30 345/211 |
| 2016/0148922 A1* | 5/2016 | Kim | ............... | H01L 27/0255 361/56 |
| 2017/0067957 A1* | 3/2017 | Lee | ............... | G01R 31/2635 |
| 2017/0186373 A1* | 6/2017 | Nishikawa | ............... | G11C 19/28 |
| 2018/0130423 A1* | 5/2018 | Kim | ............... | G09G 3/3258 |
| 2018/0144687 A1* | 5/2018 | Lin | ............... | G09G 3/3258 |

* cited by examiner

DRIVING CIRCUIT FOR REAL-TIME EXTERNAL COMPENSATION AND ELECTROLUMINESCENT DISPLAY INCLUDING THE SAME

CROSS-REFERENCE TO RELATED APPLICATION

This application claims priority from and the benefit of Korea Patent Application No. 10-2016-0146820, filed Nov. 4, 2016, which is incorporated herein by reference for all purposes as if fully set forth herein.

BACKGROUND

Technical Field

The present disclosure relates to a driving circuit for real-time external compensation and an electroluminescent display device including the same.

Description of the Related Art

An electroluminescent display is classified into an inorganic electroluminescent display and an organic electroluminescent display depending on a material of an emission layer. In particular, an active matrix organic light emitting diode (OLED) display includes a plurality of OLEDs capable of emitting light by themselves and has many advantages, such as fast response time, high emission efficiency, high luminance, wide viewing angle, and the like.

An OLED serving as a self-emitting element includes an anode electrode, a cathode electrode, and an organic compound layer between the anode electrode and the cathode electrode. The organic compound layer includes a hole injection layer HIL, a hole transport layer HTL, an emission layer EML, an electron transport layer ETL, and an electron injection layer EIL. When power (voltage) is applied to the anode electrode and the cathode electrode, holes passing through the hole transport layer HTL and electrons passing through the electron transport layer ETL move to the emission layer EML and form excitons. As a result, the emission layer EML generates visible light.

An OLED display includes a plurality of pixels, each including an OLED and a thin film transistor (TFT) that adjusts a luminance of an image implemented on the pixels based on a grayscale of image data. The driving TFT controls a driving current flowing into the OLED depending on a voltage (hereinafter, referred to as "a gate-to-source voltage") between a gate electrode and a source electrode of the driving TFT. An amount of light emitted by the OLED is determined depending on the driving current of the OLED, and the luminance of the image is determined depending on the amount of light emitted by the OLED.

In general, when a driving TFT operates in a saturation region, a driving current Ids flowing between a drain electrode and a source electrode of the driving TFT is expressed by the following Equation 1.

$$Ids = \frac{1}{2} * (\mu * C * W/L) * (Vgs - Vth)^2 \quad \text{Equation 1:}$$

In the above Equation 1, $\mu$ is electron mobility, C is a capacitance of a gate insulating layer, W is a channel width of the driving TFT, and L is a channel length of the driving TFT. In addition, Vgs is a voltage between a gate electrode and a source electrode of the driving TFT, and Vth is a threshold voltage (or a critical voltage) of the driving TFT. A gate-to-source voltage Vgs of the driving TFT may be a voltage differential between a data voltage and a reference voltage in accordance with a pixel structure. The data voltage is an analog voltage corresponding to a grayscale of image data, and the reference voltage is a fixed voltage. Therefore, the gate-to-source voltage Vgs of the driving TFT is programmed or set depending on the data voltage. Then, the driving current Ids is determined depending on the programmed gate-to-source voltage Vgs.

Electrical characteristics of the pixel, such as the threshold voltage Vth and the electron mobility $\mu$ of the driving TFT and a threshold voltage of the OLED, may be factors in determining an amount of driving current Ids of the driving TFT. Therefore, all the pixels should have the same electrical characteristics. However, a variation in the electrical characteristics between the pixels may be caused by various factors such as manufacturing process characteristics and time-varying characteristics. The variation in the electrical characteristics between the pixels may lead to a luminance variation, and it is difficult to implement desired images or meet image quality requirements.

In order to compensate for the luminance variation between the pixels, there are so-called external compensation techniques for sensing electrical characteristics of the pixels and correcting (or compensating for) an input image based on the sensing result. In order to compensate for the luminance variation, a current change by an amount of $\Delta y$ has to be ensured when the data voltage applied to the pixel is changed by an amount of "$\Delta x$." Thus, the external compensation technique is to implement the same (or effectively the same) brightness by calculating "$\Delta x$" for each pixel and applying the same driving current to the OLED. Namely, the external compensation technique may be implemented to adjust the gray levels so that the pixels have the same or effectively the same brightness.

The electrical characteristics of the pixels may continuously change during the driving of the pixels. Thus, a real-time compensation technique for compensating for changes in the electrical characteristics of each pixel in real time may be needed to increase an external compensation performance.

In order to implement such real-time compensation techniques, a method has been proposed to perform a sensing drive operation in a vertical blanking interval, in which input image data is not written. The vertical blanking interval is disposed between every adjacent vertical active period in which input image data is written in one frame. A related art driving circuit for external compensation senses one display line in a vertical blanking interval of each frame period. To this end, a gate driver included in the related art driving circuit for external compensation generates a sensing gate signal during the vertical blanking interval and applies the sensing gate signal to pixels formed on a sensing target display line. The gate driver includes a plurality of cascade-connected stages.

A length of the vertical blanking interval is much shorter than a length of the vertical active period. Because each of the stages constituting the gate driver receives an output signal of a previous stage as a carry signal and sequentially operates in response to the carry signal, limited time of the vertical blanking interval may be insufficient to generate a desired sensing gate signal. For example, an Nth sensing gate signal generated in an Nth stage is necessary to sense an Nth display line of a display panel having a vertical resolution of "N." However, because the Nth stage is driven after all of the first to (N−1)th stages are sequentially driven, all of the stages included in the gate driver have to be driven to generate the Nth sensing gate signal. However, one vertical blanking interval does not provide enough time to operate all the stages of the gate driver. Such a problem is magnified and becomes more significant as the vertical resolution of the display panel increases and as the number of display lines to be sensed in one vertical blanking interval increases.

BRIEF SUMMARY

The present disclosure provides a driving circuit for real-time external compensation and an electroluminescent display device including the same, capable of generating a desired sensing gate signal without time constraints by performing a sensing drive in a vertical active period.

In one aspect, there is provided a driving circuit for external compensation including a timing controller configured to generate a gate shift clock group, a gate start pulse, and first and second selection signals; and a gate driver configured to generate a gate signal based on the control of the timing controller and supply the gate signal to a display panel, wherein the gate driver includes a plurality of stages configured to shift the gate start pulse in accordance with the gate shift clock group to generate an output signal and supply the output signal to a first output node; a first output control switch connected between a second output node connected to a gate line of the display panel and the first output node, the first output control switch being turned on in response to the first selection signal to connect the first output node to the gate line; and a second output control switch connected between the second output node and an input terminal of a gate low voltage, the second output control switch being turned on in response to the second selection signal to connect the input terminal of the gate low voltage to the gate line.

In another aspect, there is provided an electroluminescent display including a display panel including a first display line for a display drive operation and a second display line for a sensing drive operation, a plurality of pixels displaying an input image being disposed on the first display line, a plurality of pixels, of which electrical characteristics are sensed, being disposed on the second display line; a timing controller configured to generate a gate shift clock group, a gate start pulse, and first and second selection signals including a period in which phases of the first and second selection signals are opposite to each other; and a gate driver configured to generate a gate signal based on the control of the timing controller and supply the gate signal to the display panel, wherein the gate driver includes a plurality of stages configured to shift the gate start pulse in accordance with the gate shift clock group to generate an output signal and supply the output signal to a first output node; a first output control switch connected between a second output node and the first output node, the first output control switch being turned on in response to the first selection signal to connect the first output node to the second output node; and a second output control switch connected between the second output node and an input terminal of a low potential voltage, the second output control switch being turned on in response to the second selection signal to connect the input terminal of the low potential voltage to the second output node, wherein the second output node is connected to the first display line or the second display line.

BRIEF DESCRIPTION OF THE SEVERAL VIEWS OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
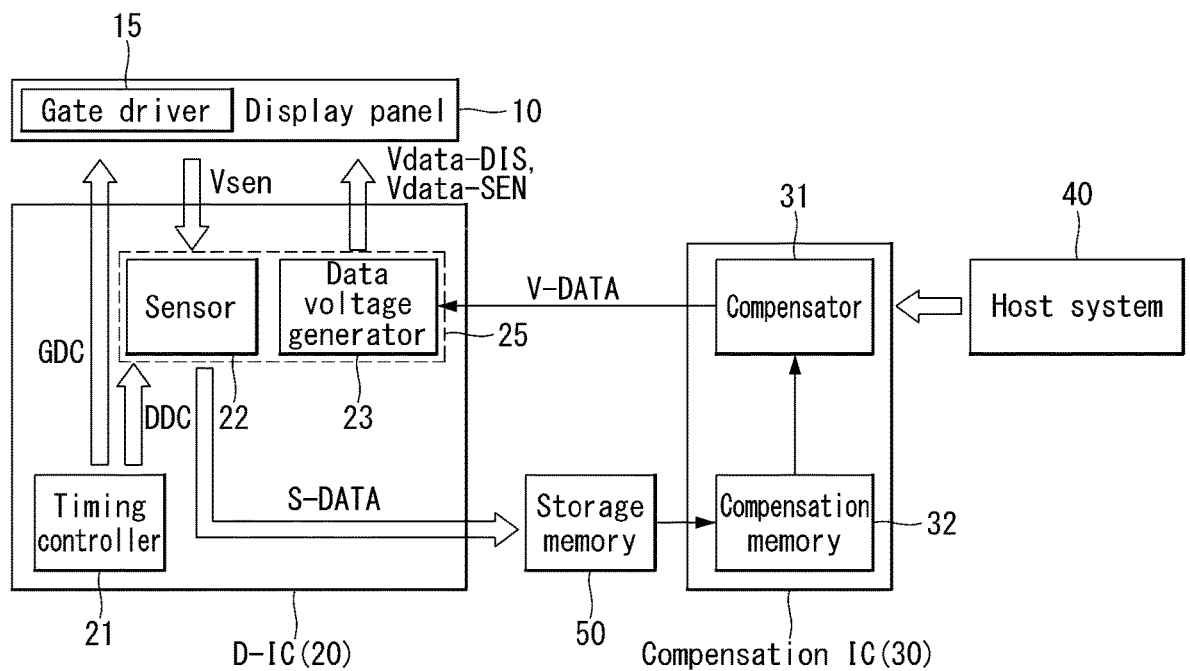
FIG. 1 is a block diagram of an electroluminescent display for external compensation according to an example embodiment.

Reference will now be made in detail to embodiments of the present disclosure, examples of which are illustrated in the accompanying drawings. However, the present disclosure is not limited to embodiments disclosed below, and may be implemented in various forms. These embodiments are provided so that the present disclosure will be described more completely, and will fully convey the scope of the present disclosure to those skilled in the art to which the present disclosure pertains. Particular features of the present disclosure can be defined by the scope of the claims.

Shapes, sizes, ratios, angles, number, and the like illustrated in the drawings for describing embodiments of the present disclosure are merely example, and the present disclosure is not limited thereto unless specified as such. Like reference numerals designate like elements throughout. In the following description, when a detailed description of certain functions or configurations related to this document that may unnecessarily cloud the gist of the invention have been omitted.

In the present disclosure, when the terms "include," "have," "comprised of," etc. are used, other components may be added unless "~only" is used. A singular expression can include a plural expression as long as it does not have an apparently different meaning in context.

In the explanation of components, even if there is no separate description, it is interpreted as including margins of error or an error range.

In the description of positional relationships, when a structure is described as being positioned "on or above," "under or below," "next to" another structure, this description should be construed as including a case in which the structures directly contact each other as well as a case in which a third structure is disposed therebetween.

The terms "first," "second," etc. may be used to describe various components, but the components are not limited by such terms. The terms are used only for the purpose of distinguishing one component from other components. For example, a first component may be designated as a second component, and vice versa, without departing from the scope of the present invention.

The features of various embodiments of the present disclosure can be partially combined or entirely combined with each other, and can be technically interlocking-driven in various ways. The embodiments can be independently implemented, or can be implemented in conjunction with each other.

Various embodiments of the present disclosure will be described in detail below with reference to the accompanying drawings. In the following embodiments, an electroluminescent display will be described focusing on an organic light emitting diode (OLED) display including an organic light emitting material. However, it should be noted that embodiments of the present disclosure are not limited to the OLED display, and may be applied to an inorganic light emitting display including an inorganic light emitting material.

Figure 2:
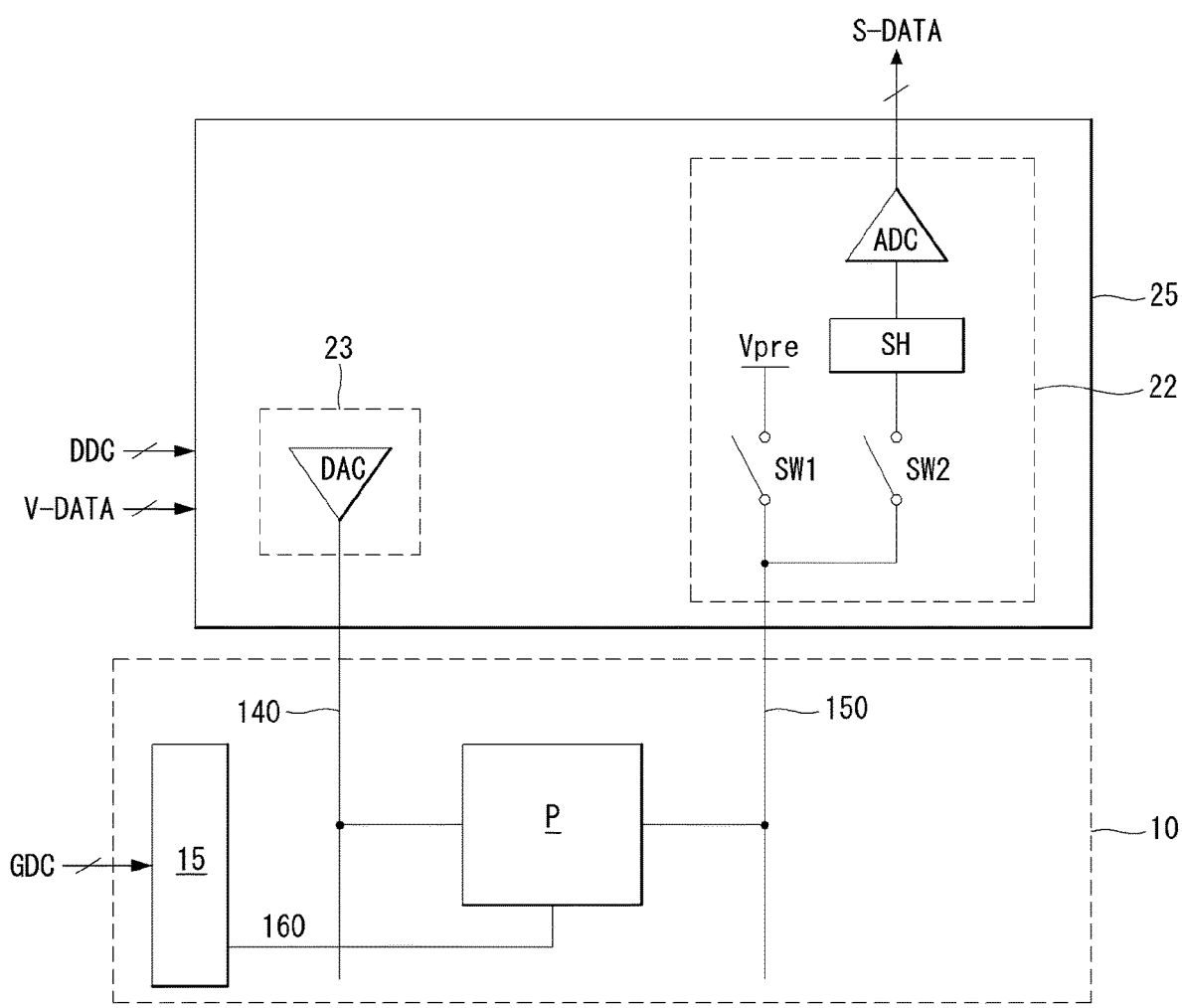
FIG. 2 schematically illustrates a connection configuration between a driving circuit for real-time external compensation according to an example embodiment and a pixel.
Figure 3:
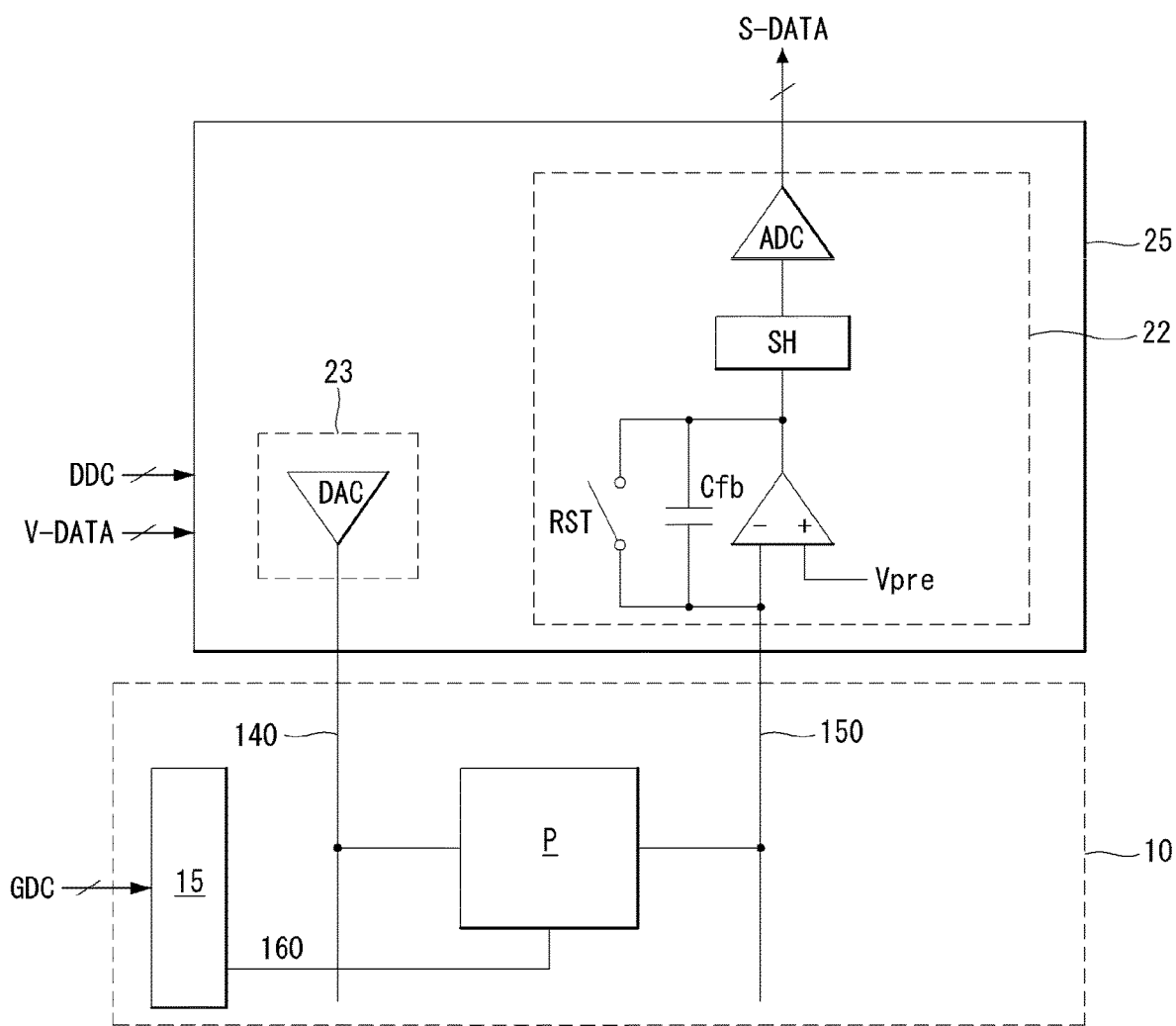
FIG. 3 illustrates another connection configuration between a driving circuit for real-time external compensation according to an example embodiment and a pixel.
Figure 4:
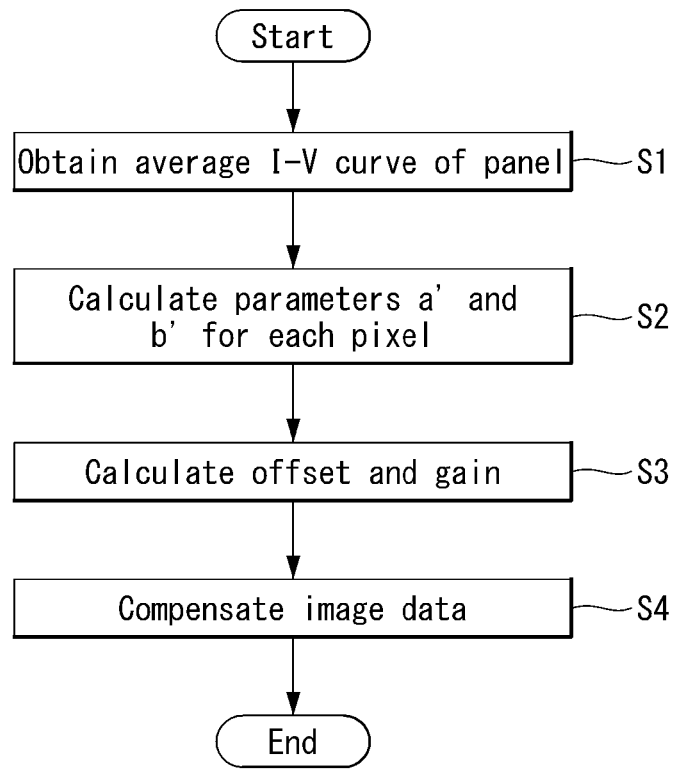
FIG. 4 is a flow chart illustrating an external compensation method according to an example embodiment.
Figure 5A:
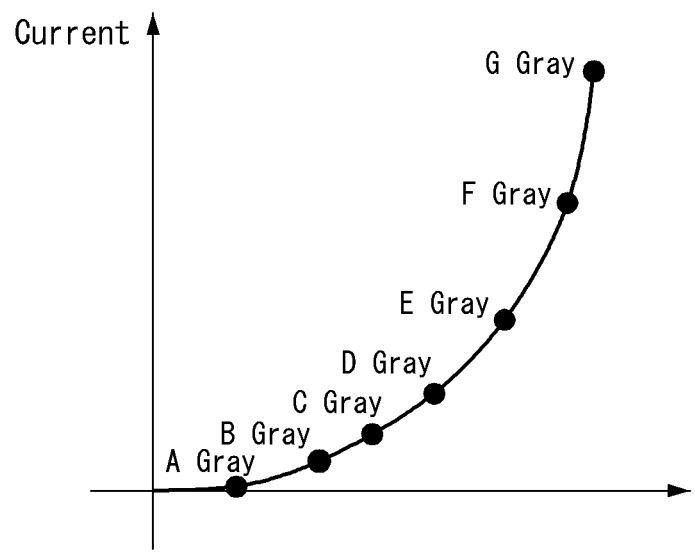
FIG. 5A illustrates that a reference curve equation is obtained in an external compensation method of FIG. 4.
Figure 5B:
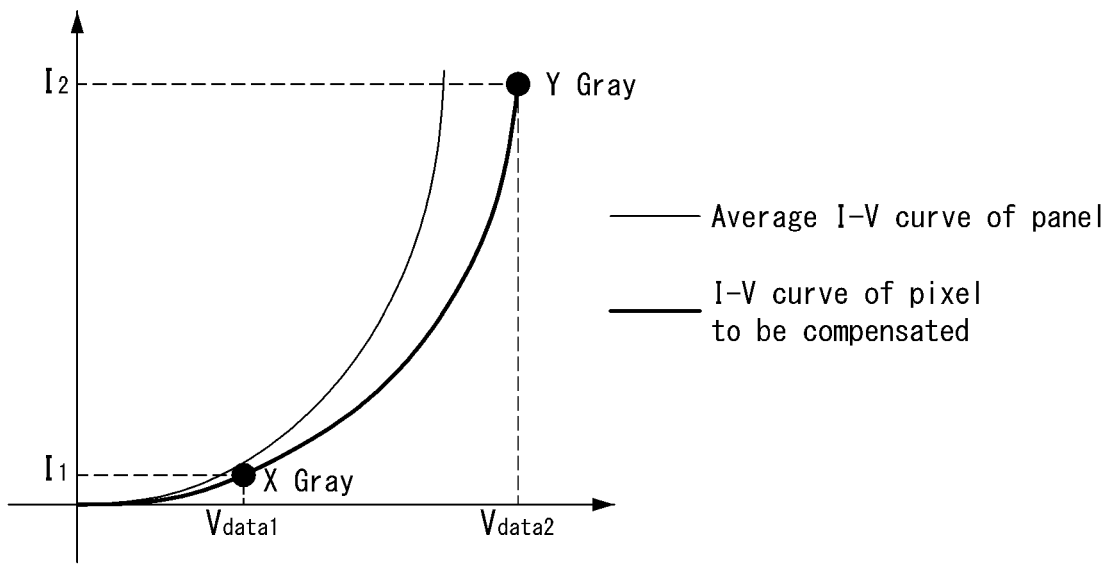
FIG. 5B illustrates an average I-V curve of a display panel and an I-V curve of a pixel to be compensated in an external compensation method of FIG. 4.
Figure 5C:
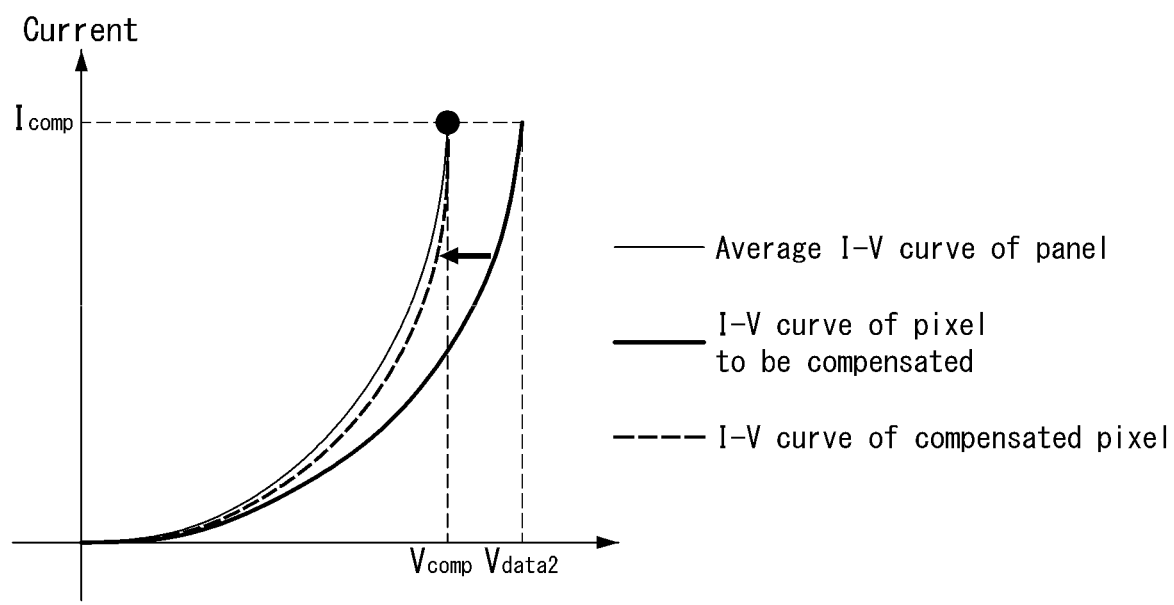
FIG. 5C illustrates an average I-V curve of a display panel, an I-V curve of a pixel to be compensated, and an I-V curve of a compensated pixel in an external compensation method of FIG. 4.

FIG. 1 is a block diagram of an electroluminescent display for external compensation according to an example embodiment. FIGS. 2 and 3 illustrate connection configurations between a driving circuit for real-time external compensation according to an example embodiment and a pixel. FIG. 4 is a flow chart illustrating an external compensation method according to an example embodiment. FIG. 5A illustrates that a reference curve equation is obtained in the external compensation method of FIG. 4. FIG. 5B illustrates an average I-V curve of a display panel and an I-V curve of a pixel to be compensated in the external compensation method of FIG. 4. FIG. 5C illustrates an average I-V curve of a display panel, an I-V curve of a pixel to be compensated, and an I-V curve of a compensated pixel in the external compensation method of FIG. 4.

Referring to FIGS. 1 to 3, an electroluminescent display according to an example embodiment may include a display panel 10, a driver IC (or referred to as "D-IC") 20, a compensation IC 30, a host system 40, and a storage memory 50. A driving circuit for real-time external compensation according to an example embodiment includes a gate driver 15 included in the display panel 10, the driver IC 20, the compensation IC 30, and the storage memory 50.

The display panel 10 includes a plurality of pixels P and a plurality of signal lines. The signal lines may include data lines 140 for supplying data signals (e.g., an analog data voltage Vdata) to the pixels P and gate lines 160 for supplying a gate signal to the pixels P. In embodiments disclosed herein, the gate signal may include a first gate signal and a second gate signal. In this instance, each gate line 160 may include a first gate line for supplying the first gate signal and a second gate line for supplying the second gate signal. The signal lines may further include sensing lines 150 that are used to sense electrical characteristics of the pixels P. However, the sensing lines 150 may be omitted depending on a circuit configuration of the pixels P. In this instance, the electrical characteristics of the pixels P may be sensed through the data lines 140.

The pixels P of the display panel 10 are disposed in a matrix to form a pixel array. Each pixel P may be connected to one of the data lines 140, one of the sensing lines 150, and at least one of the gate lines 160. Each pixel P is configured to receive a high potential pixel power and a low potential pixel power from a power source or a power generator. To this end, the power generator may supply the high potential pixel power to the pixel P through a high potential pixel power line or a pad and may supply the low potential pixel power to the pixel P through a low potential pixel power line or a pad.

The driver IC 20 may include a timing controller 21 and a data driver 25. The data driver 25 may include a sensor 22 and a data voltage generator 23. However, embodiments are not limited thereto.

The timing controller 21 may generate a gate timing control signal GDC for controlling operation timing of the gate driver 15 and a data timing control signal DDC for controlling operation timing of the data driver 25 based on timing signals, for example, a vertical sync signal Vsync, a horizontal sync signal Hsync, a dot clock signal DCLK, and a data enable signal DE received from the host system 40.

The data timing control signal DDC may include a source start pulse, a source sampling clock, and a source output enable signal, and the like, but is not limited thereto. The source start pulse controls start timing of data sampling of the data voltage generator 23. The source sampling clock is a clock signal that controls the sampling timing of data based on a rising edge or a falling edge thereof. The source output enable signal controls output timing of the data voltage generator 23.

The gate timing control signal GDC may include a gate start pulse, a gate shift clock, and the like, but is not limited thereto. The gate start pulse is applied to a stage of the gate driver 15 for generating a first output and activates an operation of the stage. The gate shift clock is a clock signal that is commonly input to stages and shifts the gate start pulse. The gate timing control signal GDC may include a first selection signal SEL and a second selection signal SELB illustrated in FIGS. 17 to 22.

The timing controller 21 controls a sensing drive operation on sensing target display line(s) and a display drive operation on display target display lines in a vertical active period of each frame in accordance with a particular sequence. In the following description, the display line, on which the sensing drive operation is performed, is referred to as a "sensing target display line," and the display line, on which the display drive operation is performed, is referred to as a "display target display line." The sensing drive operation is an operation of sensing electrical characteristics of corresponding pixels P disposed on the sensing target display line(s) in a J-th frame (where "J" is a positive integer), converting a sensing result (i.e., an analog sensing voltage Vsen) of the corresponding pixels P into digital sensing data S-DATA, and updating a compensation value for compensating for changes in the electrical characteristics of the corresponding pixels P based on the digital sensing data S-DATA. The display drive operation is an operation of displaying an input image on previously sensed display lines (i.e., display target display lines). More specifically, the display drive operation modulates digital image data to be input to previously sensed pixels P based on the updated compensation value, converts modulated digital image data V-DATA into an analog data voltage Vdata, and applies the analog data voltage Vdata to the corresponding pixels P in a (J+1)th frame, thereby displaying an input image on the previously sensed pixels P.

The timing controller 21 may differently generate timing control signals GDC and DDC for the display drive operation and timing control signals GDC and DDC for the sensing drive operation. However, embodiments are not limited thereto. The sensing drive operation may be performed in the vertical active period together with the display drive operation based on the control of the timing controller 21. When the sensing drive operation is performed in the vertical active period, a desired sensing gate signal can be generated without time constraints. This will be described later with reference to FIGS. 12 to 21.

The data voltage generator 23 includes a digital-to-analog converter (DAC) converting a digital signal into an analog signal. The data voltage generator 23 generates a display data voltage Vdata-DIS for the display drive operation and applies the display data voltage Vdata-DIS to the previously sensed pixels P of the display panel 10. To this end, the data voltage generator 23 may convert digital image data V-DATA modulated by the compensation IC 30 into an analog gamma voltage and output a conversion result to the data lines 140 as the display data voltage Vdata-DIS. Further, the data voltage generator 23 generates a sensing data voltage Vdata-SEN for the sensing drive operation and applies the sensing data voltage Vdata-SEN to the sensing target pixels P of the display panel 10 through the data lines 140.

In order to perform the sensing drive operation, the sensor 22 may sense electrical characteristics of the sensing target pixels P, for example, electrical characteristics of driving elements and/or light emitting elements included in the sensing target pixels P through the sensing lines 150. The sensor 22 may include a voltage sensing unit or a current sensing unit. The voltage sensing unit may sense a voltage charged to a specific node of the sensing target pixel P as an analog sensing voltage Vsen. The current sensing unit may directly sense a current flowing in a specific node of the sensing target pixel P and obtain an analog sensing voltage Vsen.

As shown in FIG. 2, the voltage sensing unit includes a sample and hold circuit SH, an analog-to-digital converter (ADC), and first and second switches SW1 and SW2. The voltage sensing unit senses a voltage of a source electrode of a driving element (i.e., the voltage of the source electrode of the driving element stored in a line capacitor of the sensing line 150), that depends on a pixel current of the driving element. The first and second switches SW1 and SW2 are selectively turned on. The first switch SW1 is a switch for supplying an initialization voltage Vpre to the sensing line 150, and the second switch SW2 is a switch that is turned on in synchronization with sampling timing of the analog sensing voltage Vsen. The ADC converts the analog sensing voltage Vsen sampled by the sample and hold circuit SH into digital sensing data S-DATA.

As shown in FIG. 3, the current sensing unit further includes a current integrator at a previous stage of a sample and hold circuit SH and directly senses a pixel current of a driving element flowing in the sensing line 150. The current integrator integrates the pixel current flowing through the sensing line 150 and generates the analog sensing voltage Vsen. The current integrator includes an amplifier AMP including an inverting input terminal (−) receiving the pixel current of the driving element from the sensing line 150, a non-inverting input terminal (+) receiving the initialization voltage Vpre, and an output terminal, an integrating capacitor Cfb connected between the inverting input terminal (−) and the output terminal of the amplifier AMP, and a reset switch RST connected to both ends of the integrating capacitor Cfb. The current integrator is connected to the ADC via the sample and hold circuit SH. The sample and hold circuit SH samples the analog sensing voltage Vsen output from the amplifier AMP and supplies the sampled analog sensing voltage Vsen to the ADC. The ADC converts analog sensing values Vsen sampled by the sample and hold circuit SH into digital sensing data S-DATA.

The sensor 22 may simultaneously process a plurality of analog sensing values Vsen using a plurality of ADCs in parallel and may sequentially process the plurality of analog sensing values Vsen using one ADC in series. A sampling rate of the ADC and the accuracy of the sensing are in a trade-off relationship. The ADC using a parallel processing method is advantageous to increase the accuracy of the sensing because the ADC using the parallel processing method can further reduce a sampling rate compared to the ADC using a serial processing method. The ADC may be implemented as a flash ADC, an ADC using a tracking method, a successive approximation register ADC, and the like. In the sensing drive, the ADC converts the analog sensing voltage Vsen into the digital sensing data S-DATA and then supplies the digital sensing data S-DATA to the storage memory 50.

In the sensing drive operation, the storage memory 50 stores the digital sensing data S-DATA input from the sensor 22. The storage memory 50 may be implemented as a flash memory, but is not limited thereto.

In order to perform the display drive operation, the compensation IC 30 calculates an offset and a gain for each pixel based on the digital sensing data S-DATA read from the storage memory 50. The compensation IC 30 modulates (or corrects) digital image data to be input to the previously sensed pixels P depending on the calculated offset and gain, and supplies the modulated digital image data V-DATA to the driver IC 20. To this end, the compensation IC 30 may include a compensator 31 and a compensation memory 32.

The compensation memory 32 allows access to the digital sensing data S-DATA read from the storage memory 50 to the compensator 31. The compensation memory 32 may be a random access memory (RAM), for example, a double data rate synchronous dynamic RAM (DDR SDRAM), but is not limited thereto.

As shown in FIGS. 4 to 5C, the compensator 31 may include a compensation algorithm that performs a compensation operation so that a current (I)-voltage (V) curve of a pixel to be compensated coincides with an average I-V curve. The average I-V curve may be obtained through a plurality of sensing operations.

More specifically, as shown in FIGS. 4 and 5A, the compensator 31 performs the sensing of a plurality of gray levels (for example, a total of seven gray levels A to G) and then obtains the following Equation 2 corresponding to the average I-V curve through a known least square method in step S1.

$$I=a(V_{data}-b) \quad \text{Equation 2:}$$

where "a" is electron mobility of the driving TFT, "b" is a threshold voltage of the driving TFT, and "c" is a physical property value of the driving TFT.

As shown in FIGS. 4 and 5B, the compensator 31 calculates parameter values a' and b' of the previously sensed pixel P based on current values I1 and I2 and gray values (gray levels X and Y) (i.e., data voltage values Vdata1 and Vdata2 of digital level) measured at two points in step S2.

$$I_1=a'(V_{data1}-b')$$

$$I_2=a'(V_{data2}-b') \quad \text{Equation 3:}$$

The compensator 31 may calculate the parameter values a' and b' of the previously sensed pixel P using a quadratic equation in the above Equation 3.

As shown in FIGS. 4 and 5C, the compensator 31 may calculate an offset and a gain for causing the I-V curve of the pixel to be compensated to coincide with the average I-V curve in step S3. The offset and the gain of the compensated pixel are expressed by Equation 4.

$$Vcomp = \underbrace{\left[\frac{1}{\left(\frac{a}{a'}\right)^{\frac{1}{c}}}\right]}_{\text{Gain}} \times V_{data} + \underbrace{\left[b' - b\left(\frac{a}{a'}\right)^{\frac{1}{c}}\right]}_{\text{Offset}} \quad \text{Equation 4}$$

where "Vcomp" is a compensation voltage.

The compensator 31 corrects digital image data to be input to the previously sensed pixel P so that the digital image data corresponds to the compensation voltage Vcomp, in step S4.

The host system 40 may supply digital image data to be input to the pixels P of the display panel 10 to the compensation IC 30. The host system 40 may further supply user input information, for example, digital brightness information to the compensation IC 30. The host system 40 may be implemented as an application processor.

The gate driver 15 generates a display gate signal for the display drive and supplies the display gate signal to the gate lines 160 connected to the previously sensed pixels P. The display gate signal is a signal synchronized with an application timing of the display data voltage Vdata-DIS on which a compensation value is reflected. The gate driver 15 generates a sensing gate signal for the sensing drive and supplies the sensing gate signal to the gate lines 160 connected to the sensing target pixels P. The sensing gate signal is a signal synchronized with an application timing of the sensing data voltage Vdata-SEN.

To this end, the timing controller 21 may set a pulse interval between clocks synchronized with the sensing gate signal among a gate shift clock group applied to the gate driver 15 to be greater than a pulse interval between clocks synchronized with the display gate signal among the gate shift clock group. Further, the timing controller 21 may set a pulse width of clocks synchronized with the sensing gate signal among the gate shift clock group applied to the gate driver 15 to be greater than a pulse width of clocks synchronized with the display gate signal among the gate shift clock group.

The gate driver 15 includes a gate shift register that operates in response to the gate timing control signal GDC received from a level shifter. The level shifter may be included in the timing controller 21, but is not limited thereto. The level shifter may receive the gate timing control signal GDC including the gate start pulse and N-phase gate shift clocks from the timing controller 21, where N is an integer equal to or greater than 2. The level shifter level-shifts a transistor-transistor-logic (TTL) level voltage of the gate timing control signal GDC to a gate high voltage and a gate low voltage that can switch on and off a TFT of the gate shift register. The level shifter supplies the level-shifted gate start pulse and the level-shifted N-phase gate shift clocks to the gate shift register.

The gate shift register includes a plurality of stages, each of which shifts the gate start pulse in response to the N-phase gate shift clocks in a vertical active period of each frame and outputs the display gate signal and the sensing gate signal. The plurality of stages may be cascade-connected. An operation of an uppermost stage of the plurality of stages is activated in response to the gate start pulse, and an operation of each of remaining stages is activated in response to one of output signals (for examples, carry signals) of previous stages.

The gate shift register may be directly formed on a lower substrate of the display panel 10 in a gate-in panel (GIP) manner. The gate shift register may be formed in a non-display area (i.e., a bezel area) outside the pixel array of the display panel 10 through the same TFT process as the pixel array.

Figure 6:
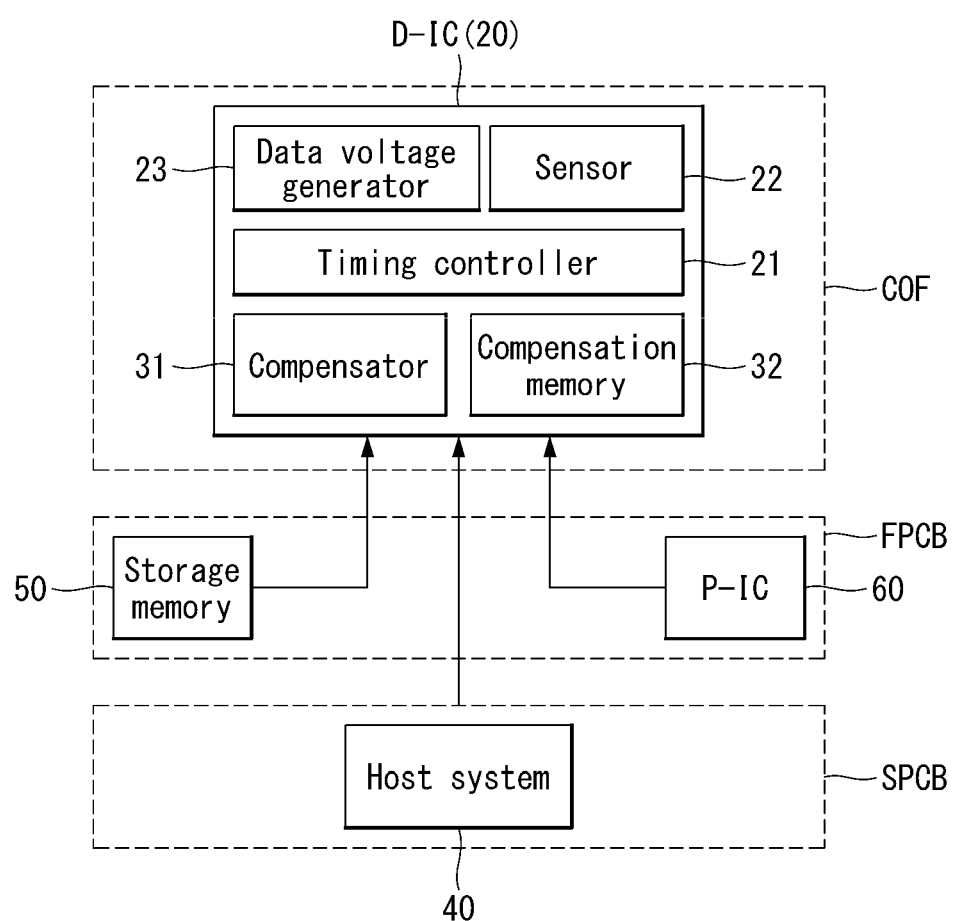
FIGS. 6 to 8 illustrate various examples of an external compensation module.
Figure 7:
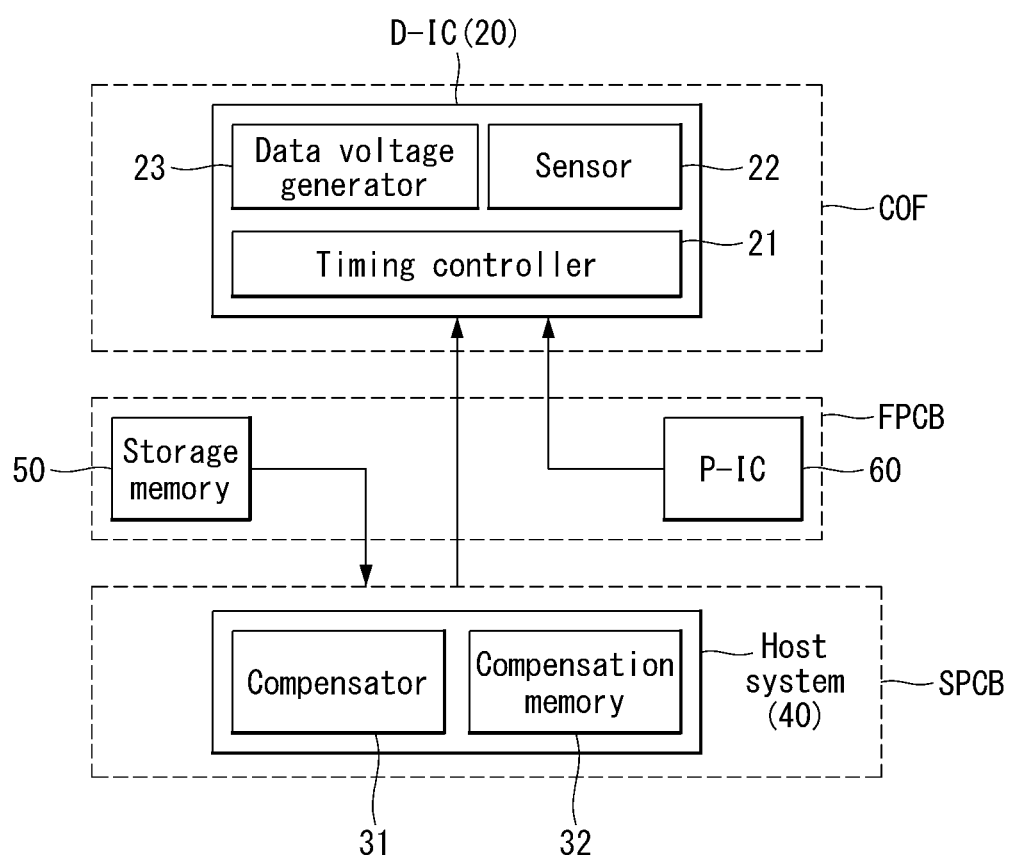
Figure 8:
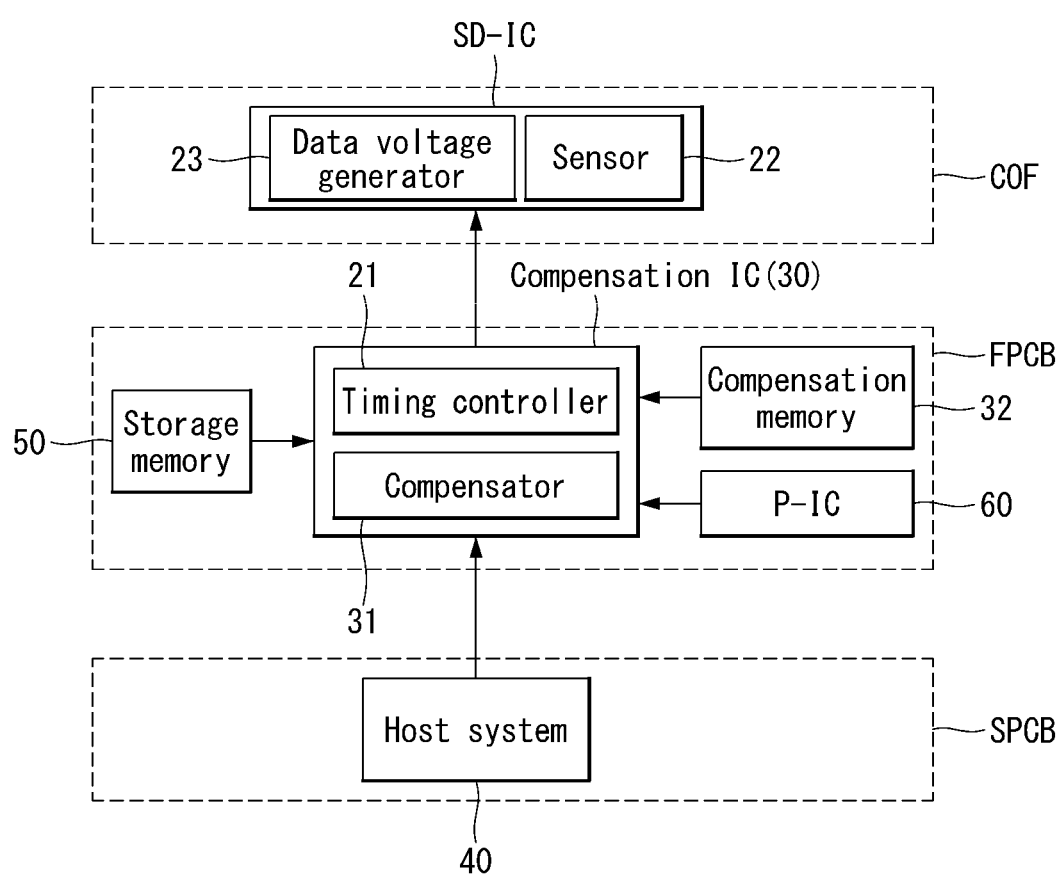

FIGS. 6 to 8 illustrate various examples of an external compensation module.

Referring to FIG. 6, the electroluminescent display according to the embodiment may include a driver IC (or referred to as "D-IC") 20 mounted on a chip-on film (COF), a storage memory 50 and a power IC (or referred to as "P-IC") 60 mounted on a flexible printed circuit board (FPCB), and a host system 40 mounted on a system printed circuit board (SPCB), in order to implement an external compensation module.

The driver IC (D-IC) 20 may further include a compensator 31 and a compensation memory 32 in addition to a timing controller 21, a sensor 22, and a data voltage generator 23. The external compensation module is implemented by combining the driver IC (D-IC) 20 and a compensation IC 30 (see FIG. 1) into one chip. The power IC (P-IC) 60 generates various driving powers required to operate the external compensation module.

Referring to FIG. 7, the electroluminescent display according to the embodiment may include a driver IC (or referred to as "D-IC") 20 mounted on a chip-on film (COF), a storage memory 50 and a power IC (or referred to as "P-IC") 60 mounted on a flexible printed circuit board (FPCB), and a host system 40 mounted on a system printed circuit board (SPCB), in order to implement an external compensation module.

The external compensation module of FIG. 7 is different from the external compensation module of FIG. 6 in that a compensator 31 and a compensation memory 32 are mounted on the host system 40 without being mounted on the driver IC 20. The external compensation module of FIG. 7 is implemented by integrating a compensation IC 30 (see FIG. 1) into the host system 40 and is meaningful in that the configuration of the driver IC 20 can be simplified.

Referring to FIG. 8, the electroluminescent display according to the embodiment may include a source driver IC SD-IC mounted on a chip-on film (COF), a storage memory 50, a compensation IC 30, a compensation memory 32, and a power IC (or referred to as "P-IC") 60 mounted on a flexible printed circuit board (FPCB), and a host system 40 mounted on a system printed circuit board (SPCB), in order to implement an external compensation module.

The external compensation module of FIG. 8 is different from the external compensation modules of FIGS. 6 and 7 in that the configuration of the source driver IC SD-IC is further simplified by mounting only a data voltage generator 23 and a sensor 22 in the source driver IC SD-IC, and a timing controller 21 and the compensation memory 32 are mounted in the compensation IC 30 that is separately manufactured. The external compensation module of FIG. 8 can easily perform an uploading and downloading operation of a compensation parameter by together mounting the compensation IC 30, the storage memory 50, and the compensation memory 32 on the flexible printed circuit board.

Figure 9:
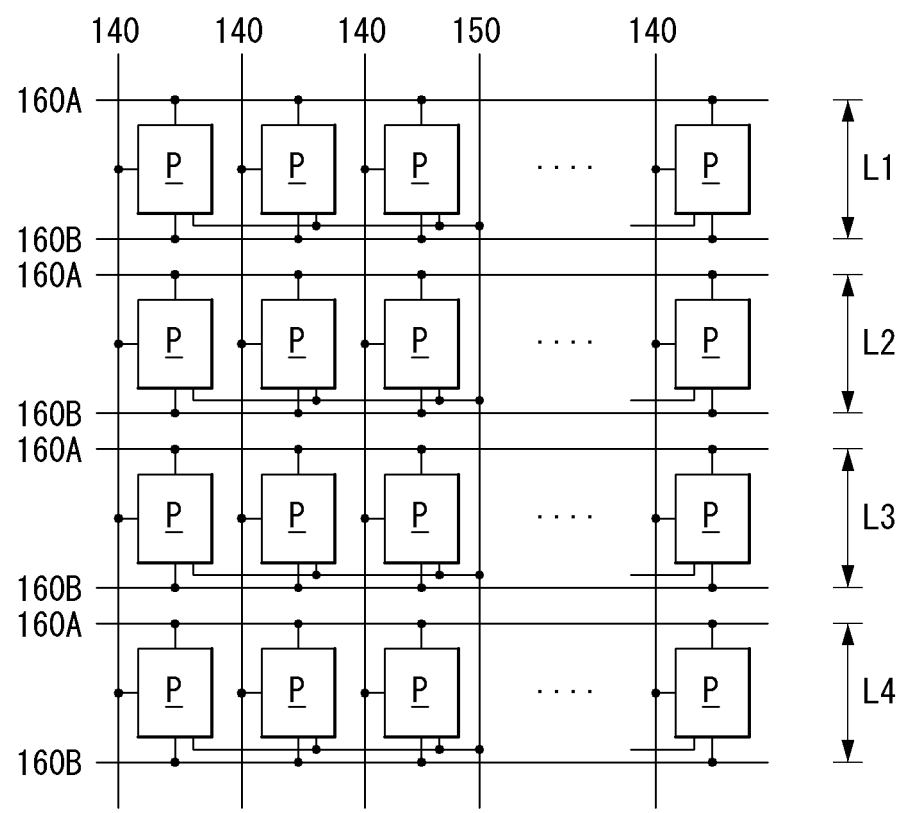
FIG. 9 illustrates an example of a pixel array included in a display panel.

FIG. 9 illustrates an example of a pixel array included in the display panel.

Referring to FIG. 9, a pixel array according to the embodiment includes a plurality of display lines L1, L2, L3 and L4 formed by adjacent pixels P. The horizontally adjacent pixels P on each of the display lines L1, L2, L3 and L4 are connected to the different data lines 140, respectively. The horizontally adjacent pixels P on each of the display lines L1, L2, L3 and L4 are connected to the different sensing lines 150 in units of M pixels, where M is a positive integer equal to or greater than 2. Hence, an aperture ratio of the display panel 10 can increase.

Referring to FIG. 9, the horizontally adjacent pixels P on each of the display lines L1, L2, L3 and L4 may be connected to a first gate line 160A and a second gate line 160B. In other words, two gate lines 160A and 160B may be allocated to each of the display lines L1, L2, L3 and L4.

Although not shown, a first gate line 160A may be individually connected to the display lines L1, L2, L3 and L4, and a second gate line 160B may be shared by two adjacent display lines. In other words, the first and second display lines L1 and L2 may share one second gate line 160B, and the third and fourth display lines L3 and L3 may share another second gate line 160B. When the pixel array is designed to share some gate lines as described above, an aperture ratio of the display panel can increase. Further, the gate driver can be simplified, and a bezel area, on which the gate driver is mounted, can decrease. In the following description, embodiments are described based on the pixel array of FIG. 9 for convenience of explanation.

Figure 10:
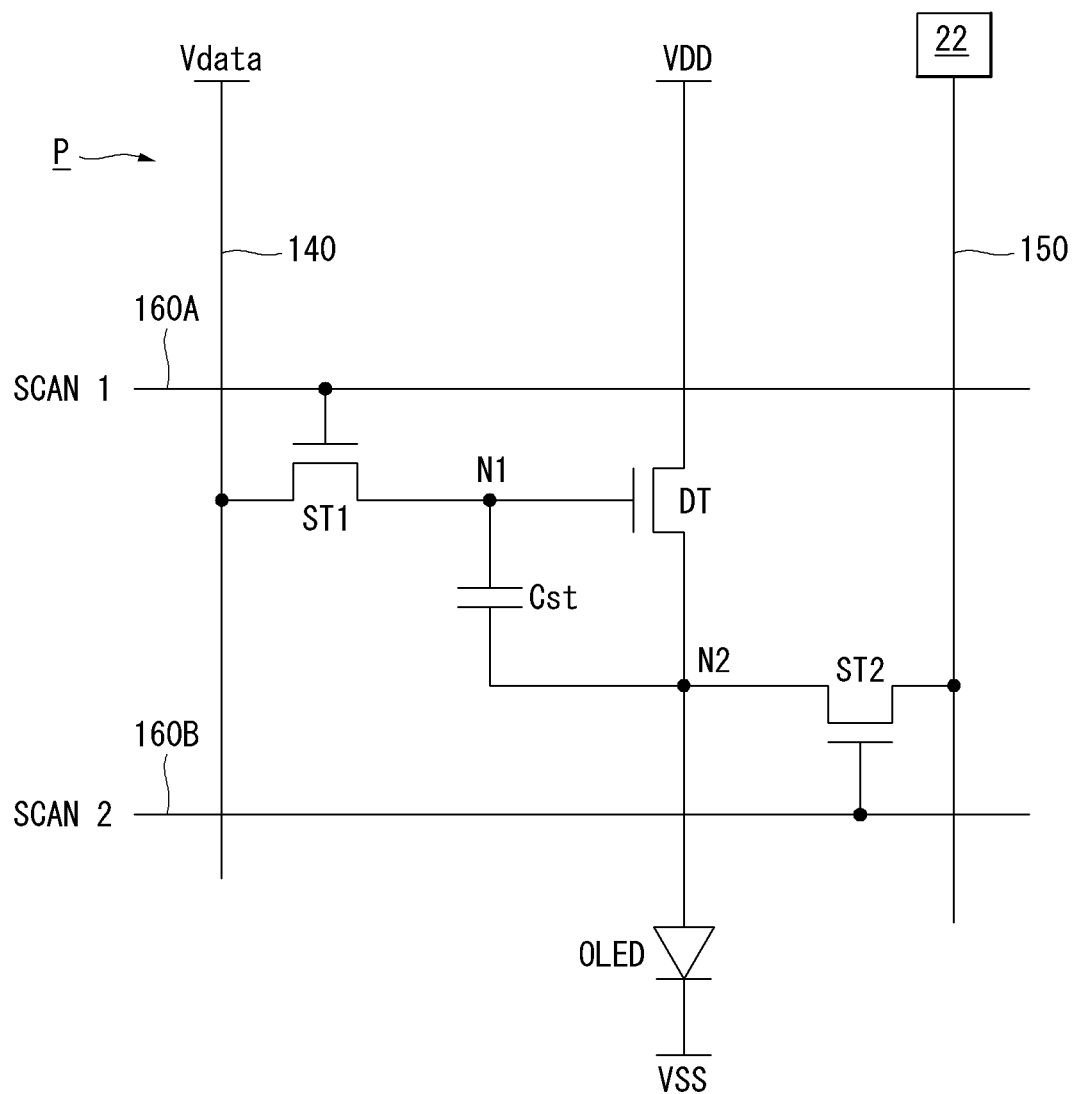
FIG. 10 is an equivalent circuit diagram of a pixel constituting a pixel array of FIG. 9.

FIG. 10 is an equivalent circuit diagram of a pixel constituting the pixel array of FIG. 9.

Referring to FIG. 10, each of pixels P constituting the pixel array may include an OLED, a driving TFT DT, a storage capacitor Cst, a first switching TFT ST1, and a second switching TFT ST2. The pixel configuration of FIG. 10 is merely an example, and embodiments are not limited thereto.

The pixel P of FIG. 10 may be a display target pixel and may be a sensing target pixel. Thus, a first gate signal SCAN1 of FIG. 10 may be a first display gate signal SCAN1 or a first sensing gate signal SCAN1, and a second gate signal SCAN2 of FIG. 10 may be a second display gate signal SCAN2 or a second sensing gate signal SCAN2. Further, a data voltage Vdata of FIG. 10 may be a display data voltage Vdata-DIS (see FIG. 1) or a sensing data voltage Vdata-SEN (see FIG. 1).

The OLED is a light emitting element that emits light with a pixel current input from the driving TFT DT. The OLED includes an anode electrode, a cathode electrode, and an organic compound layer between the anode electrode and the cathode electrode. The anode electrode is connected to a first node N1, that is a gate electrode of the driving TFT DT, via the storage capacitor Cst. The cathode electrode is connected to an input terminal of a low potential driving voltage VSS. A gray level of an image displayed on a corresponding pixel P is determined depending on an amount of light emitted by the OLED.

The driving TFT DT is a driving element controlling a pixel current input to the OLED depending on a gate-to-source voltage Vgs of the driving TFT DT. The driving TFT DT includes a gate electrode connected to the first node N1, a drain electrode connected to an input terminal of a high potential driving voltage VDD, and a source electrode connected to a second node N2.

The storage capacitor Cst is connected between the first node N1 and the second node N2. The storage capacitor Cst holds the gate-to-source voltage Vgs of the driving TFT DT for a particular time.

The first switching TFT ST1 applies the data voltage Vdata on the data line 140 to the first node N1 in response to the first gate signal SCAN1. The first switching TFT ST1 includes a gate electrode connected to the first gate line 160A, a drain electrode connected to the data line 140, and a source electrode connected to the first node N1.

The second switching TFT ST2 switches on and off a current flow between the second node N2 and the sensing line 150 in response to the second gate signal SCAN2. The second switching TFT ST2 includes a gate electrode connected to the second gate line 160B, a drain electrode connected to the sensing line 150, and a source electrode connected to the second node N2. When the second switching TFT ST2 is turned on, the second node N2 and the sensor 22 are electrically connected.

Figure 11:
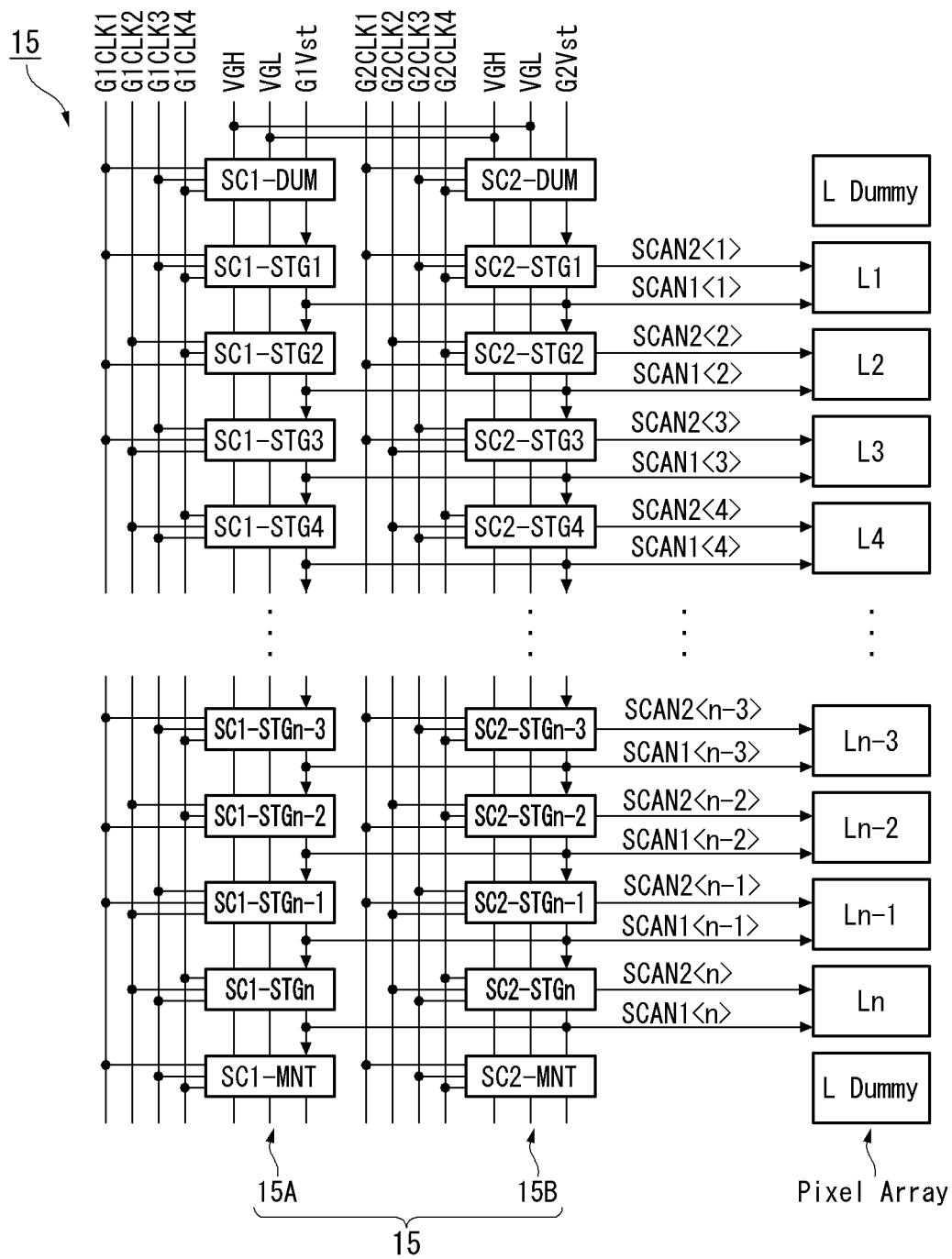
FIG. 11 illustrates an example configuration of a gate driver for driving a pixel array of FIG. 9.

FIG. 11 illustrates an example configuration of a gate driver for driving the pixel array of FIG. 9.

Referring to FIG. 11, an example configuration of the gate driver 15 according to the embodiment includes a first gate driver circuit 15A for generating a first gate signal SCAN1 to be supplied to the first gate lines 160A and a second gate driver circuit 15B for generating a second gate signal SCAN2 to be supplied to the second gate lines 160B.

More specifically, the gate driver 15 includes the first gate driver circuit 15A having as many stages SC1-STG1 to SC1-STGn as display lines L1 to Ln of the pixel array and the second gate driver circuit 15B having as many stages SC2-STG1 to SC2-STGn as the display lines L1 to Ln of the pixel array.

In FIG. 11, "SC1-DUM," "SC2-DUM," "SC1-MNT" and "SC2-MNT" denote dummy stages; "L Dummy" denotes a dummy display line; and "VGH" and "VGL" denote driving voltages applied to the stages. "VGH" is a gate high voltage, and "VGL" is a gate low voltage. The dummy stage and the dummy display line may be selectively included or excluded. Because a kickback effect of a display line adjacent to the dummy display line is reduced by the dummy stage and the dummy display line, a charging signal of the display line adjacent to the dummy display line can be stabilized. A pixel configuration of the dummy display line is similar to a pixel configuration of the display line, but may be configured not to emit light. Namely, the pixel of the dummy display line may not include an OLED or may not receive the data voltage or the gate signal.

The first gate driver circuit 15A generates a first display gate signal SCAN1 and sequentially supplies the first display gate signal SCAN1 to the first gate lines 160A positioned on the display target display lines (i.e., the first gate lines 160A connected to the display target pixels). Further, the first gate driver circuit 15A generates a first sensing gate signal SCAN1 and supplies the first sensing gate signal SCAN1 to the first gate line 160A positioned on at least one sensing target display line (i.e., the first gate line 160A connected to the sensing target pixels).

The stages SC1-STG1 to SC1-STGn constituting the first gate driver circuit 15A may be individually connected to the display lines, respectively. The stages SC1-STG1 to SC1-STGn of the first gate driver circuit 15A sequentially shift a first gate start pulse G1Vst in accordance with a first gate shift clock group including G1CLK1 to G1CLK4 and generate the first display gate signal SCAN1 and the first sensing gate signal SCAN1.

The second gate driver circuit 15B generates a second display gate signal SCAN2 and sequentially supplies the second display gate signal SCAN2 to the second gate lines 160B positioned on the display target display lines (i.e., the second gate lines 160B connected to the display target pixels). Further, the second gate driver circuit 15B generates a second sensing gate signal SCAN2 and supplies the second sensing gate signal SCAN2 to the second gate line 160B positioned on at least one sensing target display line (i.e., the second gate line 160B connected to the sensing target pixels).

The stages SC2-STG1 to SC2-STGn constituting the second gate driver circuit 15B may be individually connected to the display lines, respectively. The stages SC2-STG1 to SC2-STGn of the second gate driver circuit 15B sequentially shift a second gate start pulse G2Vst in accordance with a second gate shift clock group including G2CLK1 to G2CLK4 and generate the second display gate signal SCAN2 and the second sensing gate signal SCAN2.

Figure 12:
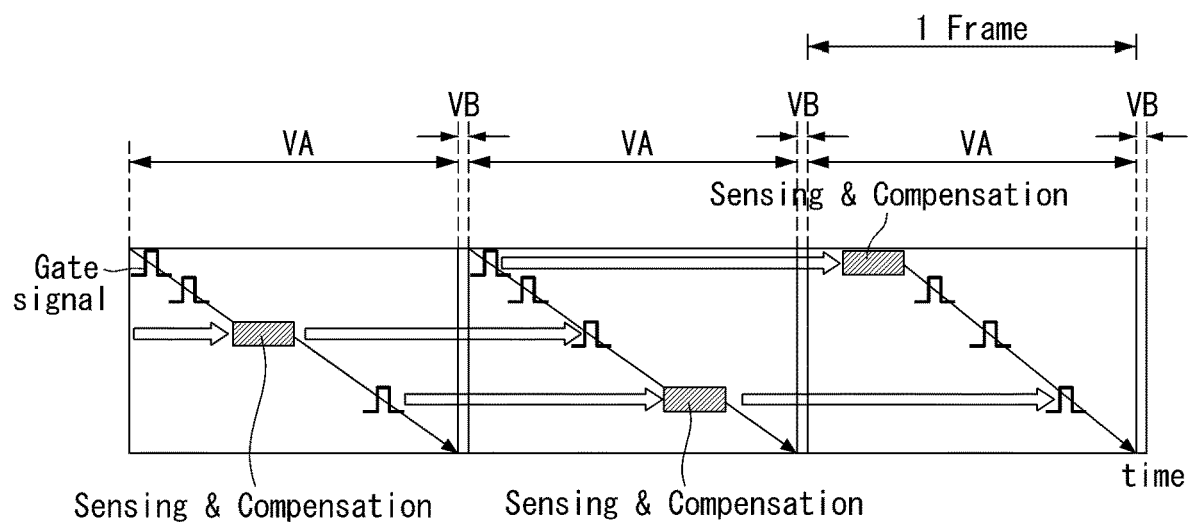
FIGS. 12 and 13 schematically illustrate a real-time external compensation technique according to an example embodiment in which real-time sensing is performed in a vertical active period of each frame.
Figure 13:
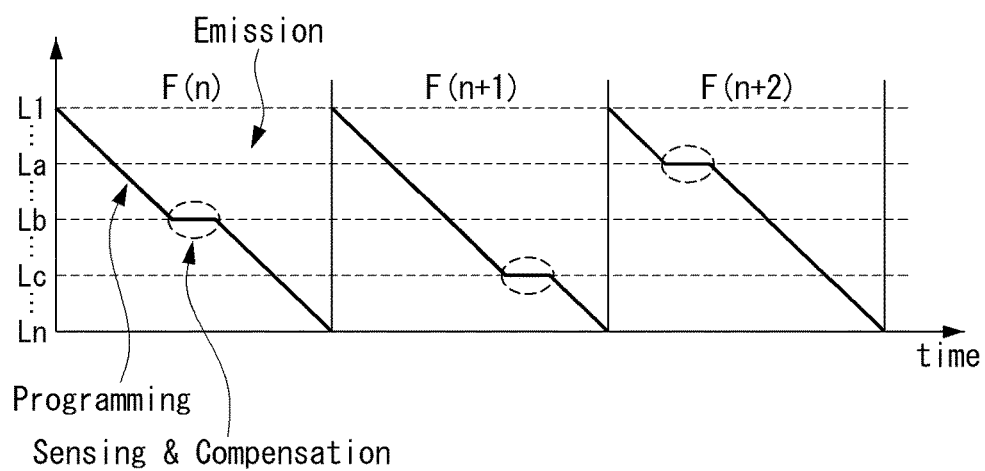

FIGS. 12 and 13 schematically illustrate a real-time external compensation technique according to an example embodiment in which real-time sensing is performed in a vertical active period of each frame.

As shown in FIG. 12, when electrical characteristics of the pixel P are sensed through a real-time external compensation method, the embodiment does not perform a sensing drive operation in a vertical blanking interval VB and performs the sensing drive operation together with a display drive operation in a vertical active period VA of each frame. The embodiment obtains digital sensing data S-DATA through the sensing drive operation and updates a compensation value based on the digital sensing data S-DATA.

The embodiment senses at least one display line every vertical active period VA of each frame. When the plurality of display lines is sensed in one vertical active period VA, the plurality of display lines may be sequentially sensed.

The sensing target pixels on the sensing target display line do not emit light. Thus, a position of the sensing target display line in each frame is previously determined in a non-sequential manner (or randomly), in order to minimize or prevent the sensing target display line from being recognized as a line dim. For example, as shown in FIG. 13, a position of the sensing target display line may be determined as a b-th display line Lb in an n-th frame Fn, as a c-th display line Lc in a (n+1)th frame F(n+1), and as an a-th display line La in a (n+2)th frame F(n+2). In embodiments disclosed herein, the display line Lc may be spatially spaced apart from the display line Lb by several to several hundreds of display lines and may be disposed below the display line Lb. Further, the display line La may be spatially spaced apart from the display line Lc by several to several hundreds of display lines and may be disposed on the display line Lc. However, embodiments are not limited thereto. The human eye responds more sensitively to sequential changes than non-sequential changes. Thus, when a position of the sensing target display line in each frame is determined in the non-sequential manner (or randomly), the sensing target display line can be minimized or prevented from being recognized as the line dim.

Because the embodiment performs the sensing drive operation together with the display drive operation in the vertical active period VA of each frame, the embodiment can easily perform the sensing drive operation on a desired display line without time constraints. More specifically, when an Nth display line of a display panel having a vertical resolution of N is sensed, a sensing drive operation of the Nth display line is performed immediately after a display drive operation of first to (N−1)th display lines is performed. Because an operation of an Nth stage is activated in response to an output signal of a (N−1)th stage, the output signal for the display drive operation of the (N−1)th stage is used as a carry signal in the sensing drive operation of the Nth display line. When the sensing drive operation of the Nth display line is performed in the vertical blanking interval VB, it takes much time to set the sensing drive operation because first to (N−1)th stages have to be additionally operated before the sensing drive operation of the Nth display line. However, when the sensing drive operation is performed together with the display drive operation in a vertical active period VA of each frame as in the embodiments, the setting time for the sensing drive operation can be drastically reduced.

An example where both the sensing drive operation and the display drive operation are performed in a vertical active period VA of one frame is described below.

Referring to FIG. 13, when the b-th display line Lb is determined as the sensing target display line in the nth frame Fn, a display drive operation (for synchronizing a display gate signal and a display data voltage with each other and applying them to pixels of a corresponding display line to program the corresponding display line and allow the corresponding display line to emit light) is sequentially performed on first to (b−1)th display lines, that are display target display lines. Then, a sensing drive operation (for synchronizing a sensing gate signal and a sensing data voltage with each other and applying them to pixels of a corresponding display line to sense electrical characteristics of the pixels) is performed on the b-th display line Lb using an output signal of a (b−1)th stage resulting from the display drive operation as a carry signal. Subsequently, a display drive operation (for synchronizing a display gate signal and a display data voltage with each other and applying them to pixels of a corresponding display line to program the corresponding display line and allow the corresponding display line to emit light) is sequentially performed on (b+1)th to nth (i.e., last) display lines based on an output signal of a b-th stage resulting from the sensing drive operation.

Further, referring to FIG. 13, when the c-th display line Lc is determined as the sensing target display line in the (n+1)th frame F(n+1), a display drive operation is sequentially performed on first to (c−1)th display lines that are display target display lines, and then a sensing drive operation is performed on the c-th display line Lc in response to an output signal of a (c−1)th stage resulting from the display drive operation. Subsequently, a display drive operation is sequentially performed on (c+1)th to nth (i.e., last) display lines based on an output signal of a c-th stage resulting from the sensing drive operation.

Further, referring to FIG. 13, when the a-th display line La is determined as the sensing target display line in the (n+2)th frame F(n+2), a display drive operation is sequentially performed on first to (a−1)th display lines that are display target display lines, and then a sensing drive operation is performed on the a-th display line La in response to an output signal of a (a−1)th stage resulting from the display drive operation. Subsequently, a display drive operation is sequentially performed on (a+1)th to nth (i.e., last) display lines based on an output signal of an a-th stage resulting from the sensing drive operation.

However, a plurality of display target display lines adjacent to the sensing target display line may be pause-driven in order to increase the accuracy of the sensing. Pixels of the pause-driven display target display lines are disconnected from the data lines and cannot be supplied with a new display data voltage. Therefore, the pixels of the pause-driven display target display lines display an image signal applied in a previous frame as it is. Further, the pixels of the pause-driven display target display lines are disconnected from the sensing line. Because switching TFTs included in the pause-driven pixels maintain a turn-off state, a potential of the sensing line is not affected by a kickback noise generated when the switching TFTs change from a turn-on state to the turn-off state. Thus, the accuracy of the sensing on the sensing target display line is increased. This will be further described with reference to FIGS. 14 to 16.

Figure 14:
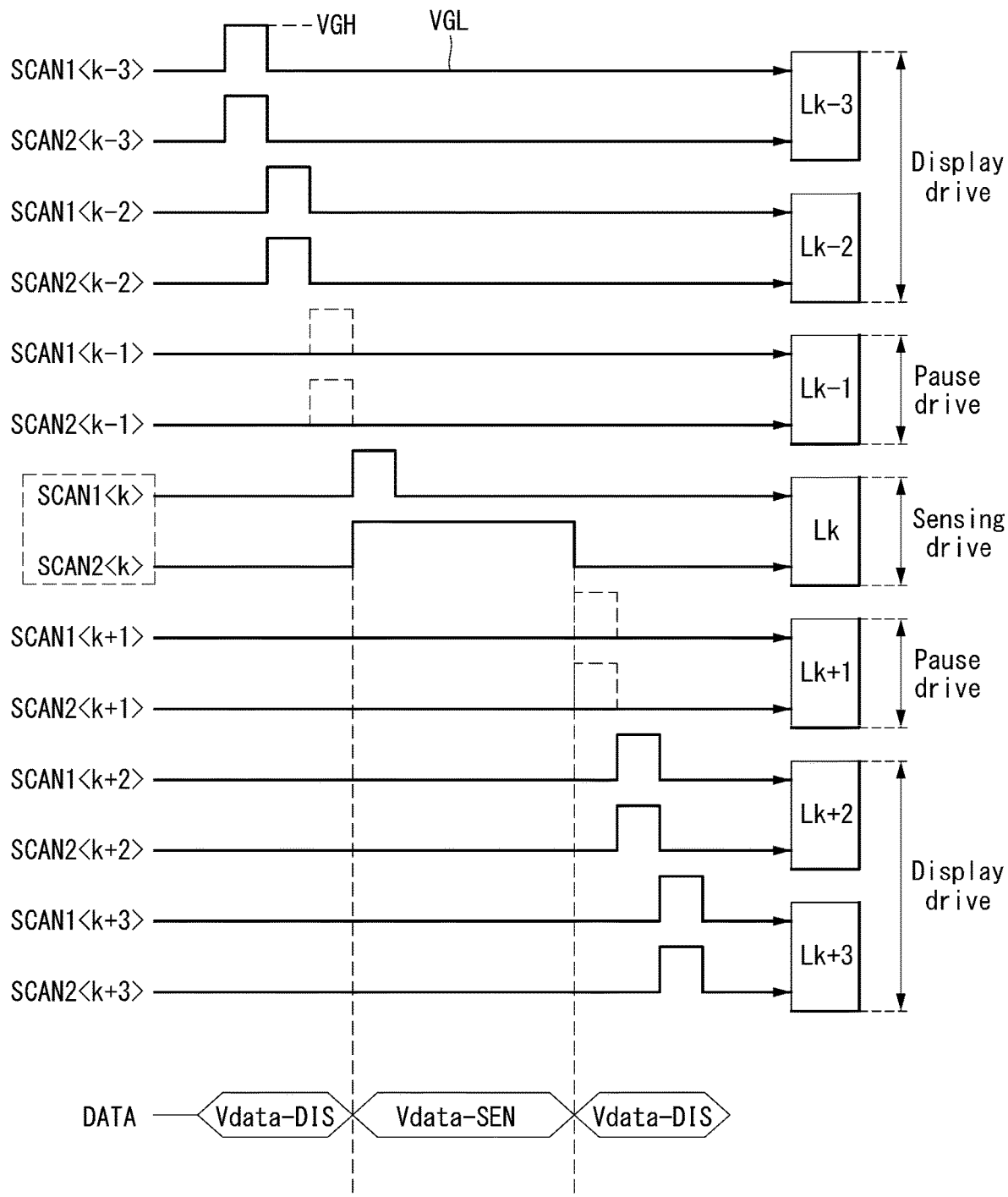
FIG. 14 is an example waveform diagram of first and second gate signals for implementing real-time sensing in a vertical active period.
Figure 15:
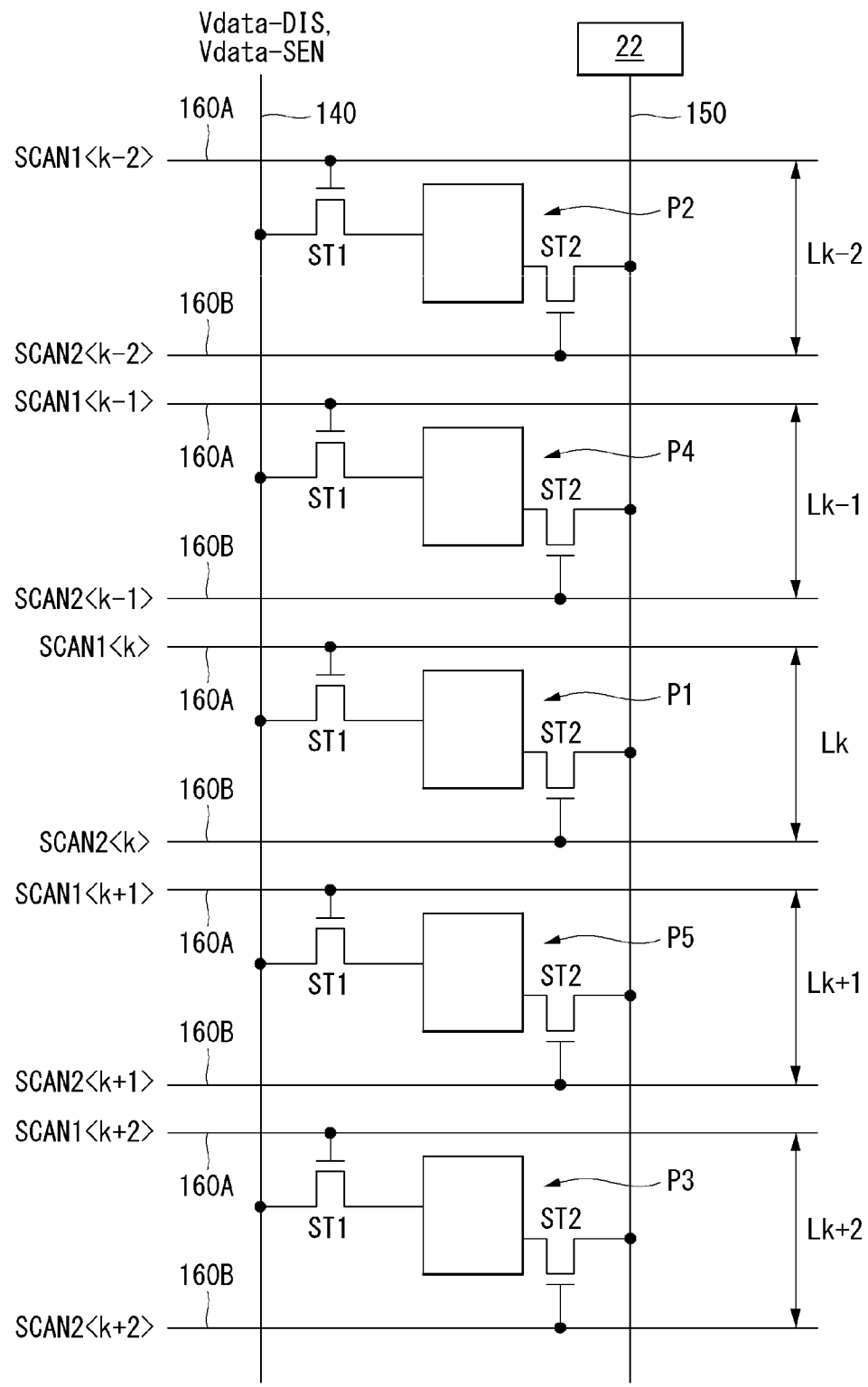
FIG. 15 illustrates a structure in which pixels of vertically adjacent display lines share one sensing line with one another.

FIG. 14 is an example waveform diagram of first and second gate signals for implementing real-time sensing in a vertical active period. FIG. 15 illustrates a structure in which pixels of vertically adjacent display lines share one sensing line with one another.

Referring to FIGS. 14 and 15, when a k-th display line Lk is determined as a sensing target display line, a (k−3)th display line Lk-3 and a (k−2)th display line Lk-2 disposed above the k-th display line Lk are sequentially display-driven, and then a (k−1)th display line Lk-1 is pause-driven. Subsequently, a (k+1)th display line L(k+1) disposed below the k-th display line Lk is pause-driven, and a (k+2)th display line Lk+2 and a (k+3)th display line Lk+3 are sequentially display-driven.

In order to perform the sensing drive operation, a k-th first gate signal SCAN1<k> for the sensing drive operation is supplied to a first gate line 160A connected to the k-th display line Lk, and a k-th second gate signal SCAN2<k> for the sensing drive operation is supplied to a second gate line 160B connected to the k-th display line Lk. A period of a gate high voltage VGH of the k-th first gate signal SCAN1<k> for the sensing drive operation and a period of a gate high voltage VGH of the k-th second gate signal SCAN2<k> for the sensing drive operation are synchronized with a supply timing of a sensing data voltage Vdata-SEN. For the sensing drive operation, the period of the gate high voltage VGH of the k-th second sensing gate signal SCAN2<k> may be wider than the period of the gate high voltage VGH of the k-th first sensing gate signal SCAN1<k>.

In a first pixel P1 included in the k-th display line Lk, a first switching TFT ST1 is turned on in response to the k-th first sensing gate signal SCAN1<k> of the gate high voltage VGH, and a second switching TFT ST2 is turned on in response to the k-th second sensing gate signal SCAN2<k> of the gate high voltage. A pixel current in accordance with the sensing data voltage Vdata-SEN flows in the first pixel P1 and is charged to the sensing line 150 through the second switching TFT ST2. The sensor 22 senses a voltage charged to the sensing line 150 and can detect electrical characteristics of the first pixel P1.

In order to perform the display drive operation, a (k−2)th first gate signal SCAN1<k−2> for the display drive operation is supplied to the first gate line 160A connected to the (k−2)th display line Lk-2, and a (k−2)th second gate signal SCAN2<k−2> for the display drive operation is supplied to the second gate line 160B connected to the (k−2)th display line Lk-2. A period of a gate high voltage VGH of the (k−2)th first gate signal SCAN1<k−2> for the display drive operation and a period of a gate high voltage VGH of the (k−2)th second gate signal SCAN2<k−2> for the display drive operation are synchronized with a supply timing of a display data voltage Vdata-DIS. A length of the period of the gate high voltage VGH of the (k−2)th first display gate signal SCAN1<k−2> may be the same as or different from a length of the period of the gate high voltage VGH of the (k−2)th second display gate signal SCAN2<k−2>.

In the programming (e.g., the setting of a gate-to-source voltage of a driving TFT) for the display drive operation in a second pixel P2 included in the (k−2)th display line Lk-2, a first switching TFT ST1 is turned on in response to the (k−2)th first display gate signal SCAN1<k−2> of the gate high voltage VGH, and a second switching TFT ST2 is turned on in response to the (k−2)th second display gate signal SCAN2<k−2> of the gate high voltage VGH. A pixel current in accordance with the display data voltage Vdata-DIS flows in the second pixel P2 and causes an OLED of the second pixel P2 to emit light.

In the same manner, for the display drive operation, a (k+2)th first gate signal SCAN1<k+2> for the display drive operation is supplied to the first gate line 160A connected to the (k+2)th display line Lk+2, and a (k+2)th second gate signal SCAN2<k+2> for the display drive operation is supplied to the second gate line 160B connected to the (k+2)th display line Lk+2. A period of a gate high voltage VGH of the (k+2)th first gate signal SCAN1<k+2> for the display drive operation and a period of a gate high voltage VGH of the (k+2)th second gate signal SCAN2<k+2> for the display drive operation are synchronized with the supply timing of the display data voltage Vdata-DIS.

In the programming (e.g., the setting of a gate-to-source voltage of a driving TFT) for the display drive operation in a third pixel P3 included in the (k+2)th display line Lk+2, a first switching TFT ST1 is turned on in response to the (k+2)th first display gate signal SCAN1<k+2> of the gate high voltage VGH, and a second switching TFT ST2 is turned on in response to the (k+2)th second display gate signal SCAN2<k+2> of the gate high voltage VGH. A pixel current in accordance with the display data voltage Vdata-DIS flows in the third pixel P3 and causes an OLED of the third pixel P3 to emit light.

In order to perform the pause drive operation, a (k−1)th first gate signal SCAN1<k−1> for the display drive operation is supplied to the first gate line 160A connected to the (k−1)th display line Lk-1, and a (k−1)th second gate signal SCAN2<k−1> for the display drive operation is supplied to the second gate line 160B connected to the (k−1)th display line Lk-1. The (k−1)th first display gate signal SCAN1<k−1> and the (k−1)th second display gate signal SCAN2<k−1> are continuously held at a gate low voltage VGL. Namely, the (k−1)th first display gate signal SCAN1<k−1> and the (k−1)th second display gate signal SCAN2<k−1> do not have a period of a gate high voltage VGH.

In a fourth pixel P4 included in the (k−1)th display line Lk-1, a first switching TFT ST1 is turned off in response to the (k−1)th first display gate signal SCAN1<k−1> of the gate low voltage VGL, and a second switching TFT ST2 is turned off in response to the (k−1)th second display gate signal SCAN2<k−1> of the gate low voltage VGL. Because the second switching TFT ST2 of the fourth pixel P4 continuously maintains a turn-off state, a potential of the sensing line is not affected by a kickback noise generated when the second switching TFT ST2 changes from a turn-on state to the turn-off state.

In the same manner, for the pause drive operation, a (k+1)th first gate signal SCAN1<k+1> for the display drive operation is supplied to the first gate line 160A connected to the (k+1)th display line Lk+1, and a (k+1)th second gate signal SCAN2<k+1> for the display drive operation is supplied to the second gate line 160B connected to the (k+1)th display line Lk+1. The (k+1)th first display gate signal SCAN1<k+1> and the (k+1)th second display gate signal SCAN2<k+1> are continuously held at a gate low voltage VGL. Namely, the (k+1)th first display gate signal SCAN1<k+1> and the (k+1)th second display gate signal SCAN2<k+1> do not have a period of a gate high voltage VGH.

In a fifth pixel P5 included in the (k+1)th display line Lk+1, a first switching TFT ST1 is turned off in response to the (k+1)th first display gate signal SCAN1<k+1> of the gate low voltage VGL, and a second switching TFT ST2 is turned off in response to the (k+1)th second display gate signal SCAN2<k+1> of the gate low voltage VGL. Because the second switching TFT ST2 of the fifth pixel P5 continuously maintains a turn-off state, a potential of the sensing line is not affected by a kickback noise generated when the second switching TFT ST2 changes from a turn-on state to the turn-off state.

Figure 16:
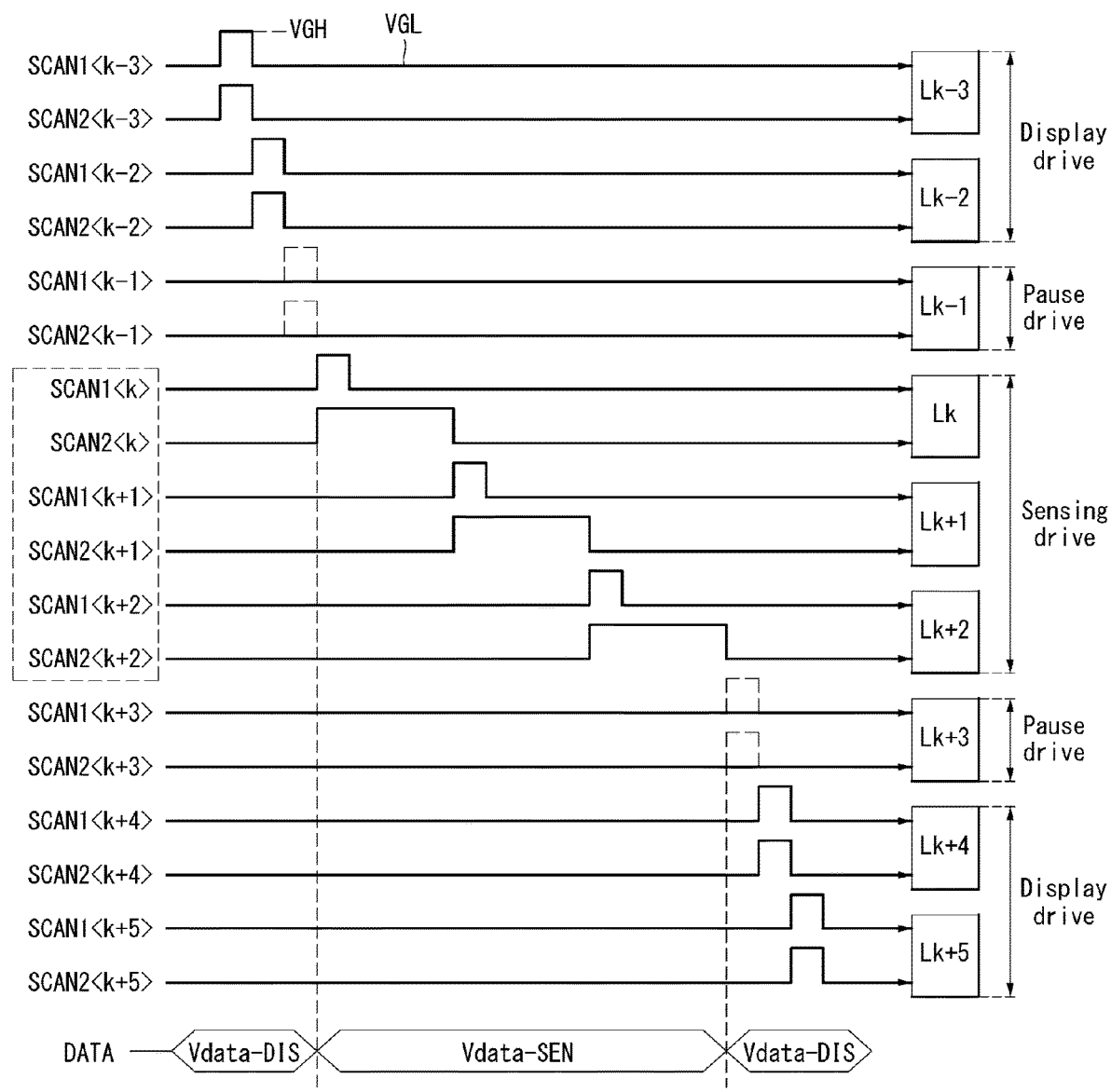
FIG. 16 is another example waveform diagram of first and second gate signals for implementing real-time sensing in a vertical active period.

FIG. 16 is another example waveform diagram of first and second gate signals for implementing real-time sensing in a vertical active period.

Configuration of FIG. 16 is substantially the same as configuration of FIG. 14, except that a plurality of sensing target display lines is used.

More specifically, when k-th to (k+2)th display lines Lk, Lk+1 and Lk+2 are determined as sensing target display lines, a (k−3)th display line Lk-3 and a (k−2)th display line Lk-2 disposed above the k-th display line Lk are sequentially display-driven, and then a (k−1)th display line Lk-1 is pause-driven. Subsequently, the k-th to (k+2)th display lines Lk, Lk+1 and Lk+2 are sequentially sensing-driven. Subsequently, a (k+3)th display line L(k+3) disposed below the (k+2)th display line Lk+2 is pause-driven, and a (k+4)th display line Lk+4 and a (k+5)th display line Lk+5 are sequentially display-driven.

Since a sensing drive operation, a display drive operation, and a pause drive operation illustrated in FIG. 16 are substantially the same as those illustrated in FIGS. 14 and 15, a further description thereof may be omitted.

FIG. 16 illustrates that one display line to be pause-driven is disposed above the sensing target display lines, and also one display line to be pause-driven is disposed below the sensing target display lines, by way of example. However, embodiments are not limited thereto. For example, a plurality of display lines to be pause-driven may be respectively disposed above and below the sensing target display lines. Because a noise resulting from a kickback effect is less mixed as the number of pause-driven display lines increases, the accuracy of the sensing can be increased. However, there is a disadvantage that the representation of an input image is reduced due to an increase in an area occupied by the pause-driven display lines. In consideration of this point, the number of pause-driven display lines may be appropriately set depending on the model and the specification of the display panel.

Figure 17:
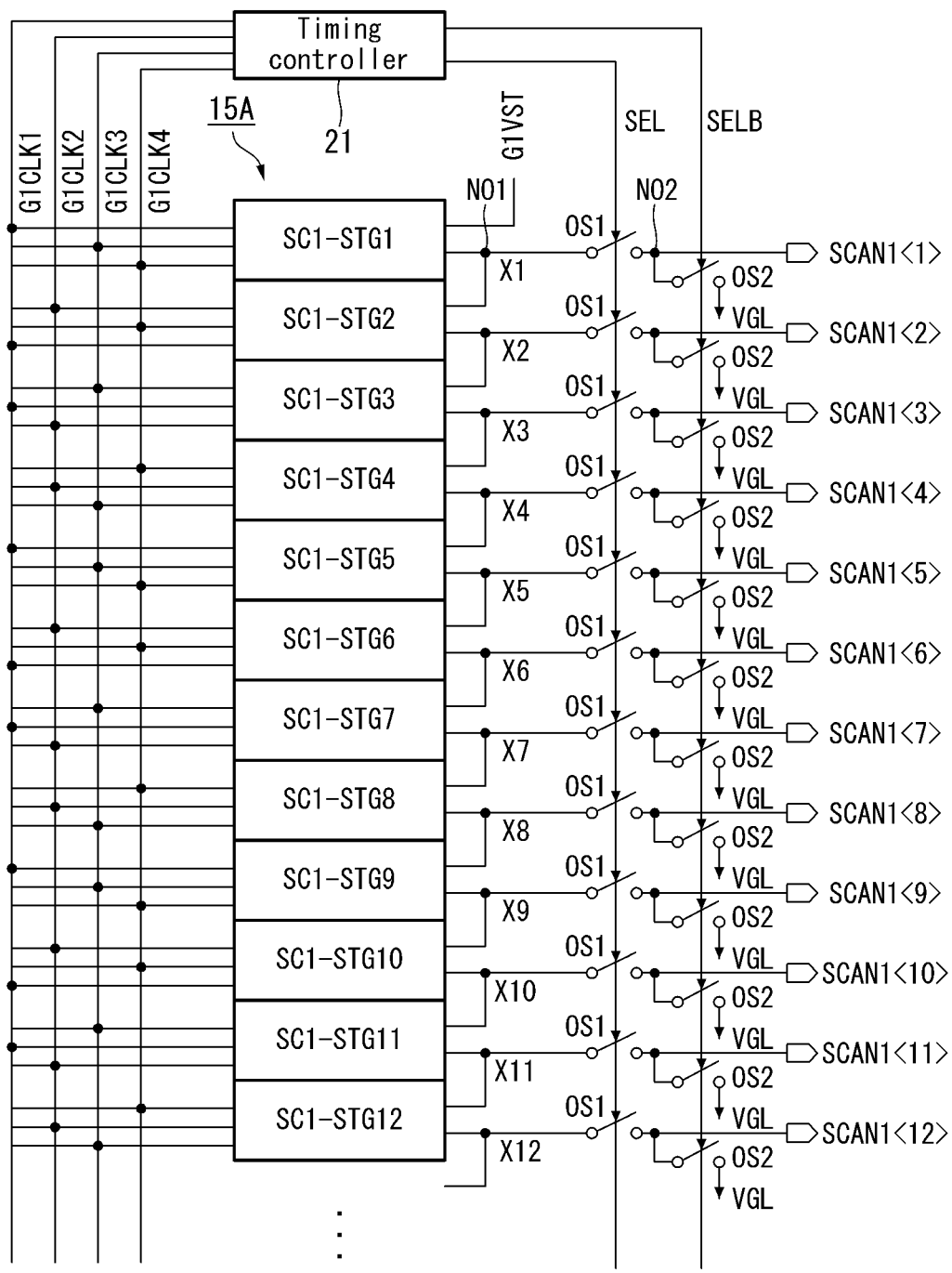
FIG. 17 illustrates configuration of a first gate driver circuit generating a first gate signal.

FIG. 17 illustrates configuration of a first gate driver circuit generating a first gate signal.

Referring to FIG. 17, the first gate driver circuit 15A according to the embodiment includes a plurality of stages SC1-STG1 to SC1-STG12 which is connected to one another in cascade.

The stages SC1-STG1 to SC1-STG12 sequentially shift a first gate start pulse G1Vst in accordance with a first gate shift clock group G1CLK1-G1CLK4 input from the timing controller 21 and generate first output signals X1 to X12. The first gate shift clock group G1CLK1-G1CLK4 may include gate shift clocks of four or more phases, so as to secure a sufficient charging time in a high speed drive.

An operation of the first stage SC1-STG1 of the plurality of stages SC1-STG1 to SC1-STG12 is activated in response to the first gate start pulse G1Vst input from the timing controller 21, and operations of the remaining stages SC1-STG2 to SC1-STG12 are activated in response to the first output signals X1 to X11 of the preceding stages. To this end, a start terminal of the first stage SC1-STG1 is connected to an input line of the first gate start pulse G1Vst. Start terminals of the remaining stages SC1-STG2 to SC1-STG12 are connected to first output nodes NO1 of the preceding stages SC1-STG1 to SC1-STG11. The first output signals X1 to X11 are carry signals for activating the operations of the remaining stages SC1-STG2 to SC1-STG12.

A first output control switch OS1 and a second output control switch OS2 are connected between each of first gate lines supplied with first gate signals SCAN1<1> to SCAN1<12> and each of the stages SC1-STG1 to SC1-STG12. Both terminals of the first output control switch OS1 are connected between the first gate line and the stage, and one terminal of the second output control switch OS2 is connected between the first gate line and the stage.

One terminal of the first output control switch OS1 is connected to a first output node NO1 supplied with the first output signals X1 to X12, and the other terminal of the first output control switch OS1 is connected to a second output node NO2. The second output node NO2 is connected to the first gate line. The first output control switch OS1 is turned on and off in response to a first selection signal SEL input from the timing controller 21. When the first output control switch OS1 is turned on, the first output node NO1 and the second output node NO2 are electrically connected to each other, and the first output signals X1 to X12 supplied to the first output node NO1 are transmitted to the second output node NO2. On the other hand, when the first output control switch OS1 is turned off, the first output node NO1 and the second output node NO2 are electrically disconnected from each other, and the first output signals X1 to X12 supplied to the first output node NO1 are not transmitted to the second output node NO2.

One terminal of the second output control switch OS2 is connected to the second output node NO2, and the other terminal of the second output control switch OS2 is connected to an input terminal of the gate low voltage VGL. The second output control switch OS2 is turned on and off in response to a second selection signal SELB input from the timing controller 21. The second selection signal SELB is opposite in phase to the first selection signal SEL. The second output control switch OS2 is turned off while the first output control switch OS1 is turned on, and is turned on while the first output control switch OS1 is turned off. When the first output control switch OS1 is turned on and the second output control switch OS2 is turned off, the first output signals X1 to X12 of the gate high voltage VGH output from the stages SC1-STG1 to SC1-STG12 are supplied as the first gate signals SCAN1<1> to SCAN1<12> to the first gate lines via the first and second output nodes NO1 and NO2. On the other hand, when the first output control switch OS1 is turned off and the second output control switch OS2 is turned on, the first output signals X1 to X12 output from the stages SC1-STG1 to SC1-STG12 are cut off, and the gate low voltage VGL is supplied as the first gate signals SCAN1<1> to SCAN1<12> to the first gate lines via the second output node NO2.

The first gate lines supplied with the first output signals X1 to X12 of the gate high voltage VGH as the first gate signals SCAN1<1> to SCAN1<12> may be positioned on a display-driven display line or on a sensing-driven display line. On the other hand, the first gate lines supplied with the gate low voltage VGL as the first gate signals SCAN1<1> to SCAN1<12> may be positioned on a pause-driven display line.

Figure 18:
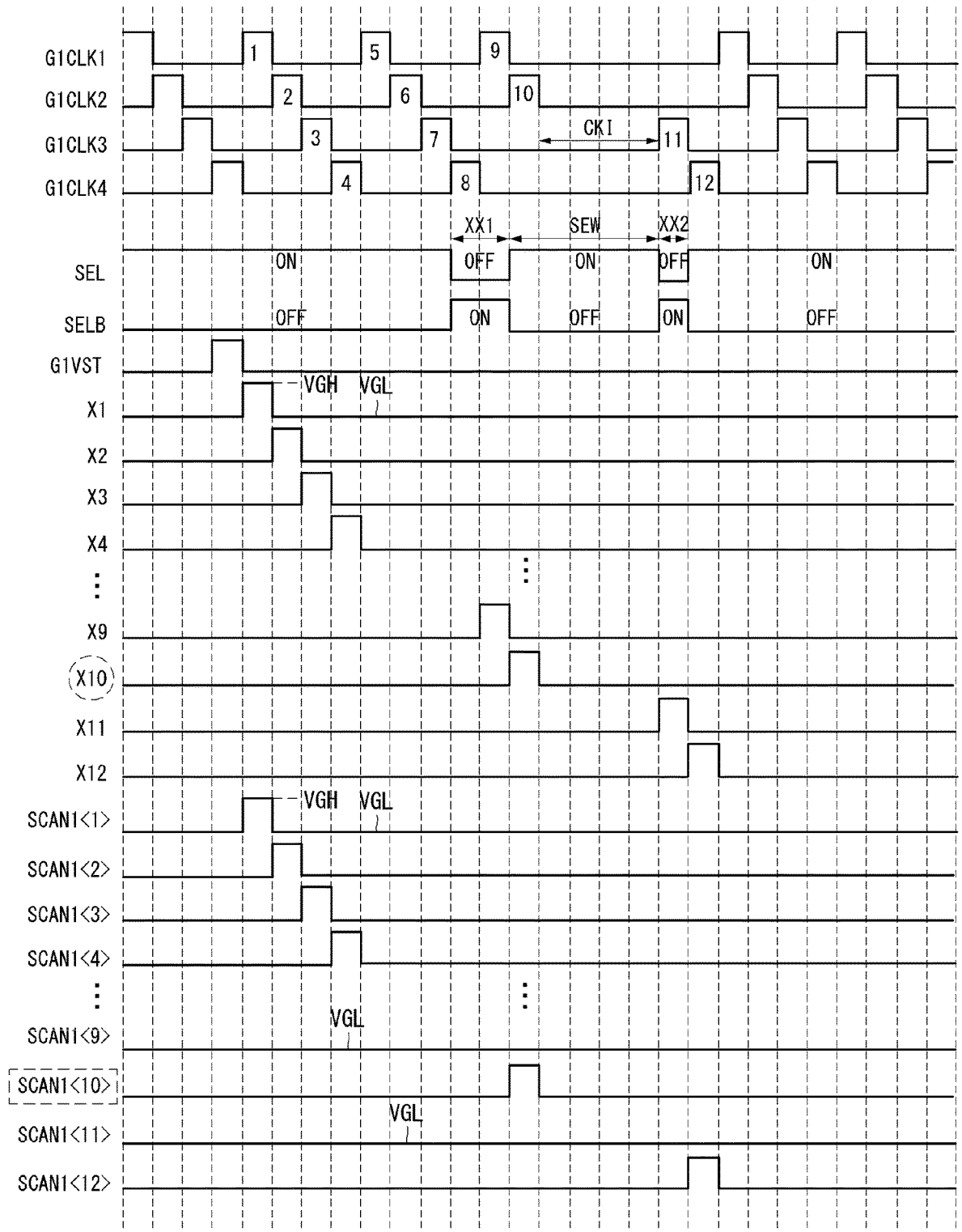
FIG. 18 is an example waveform diagram for explaining a drive of a first gate driver circuit shown in FIG. 17.
Figure 19:
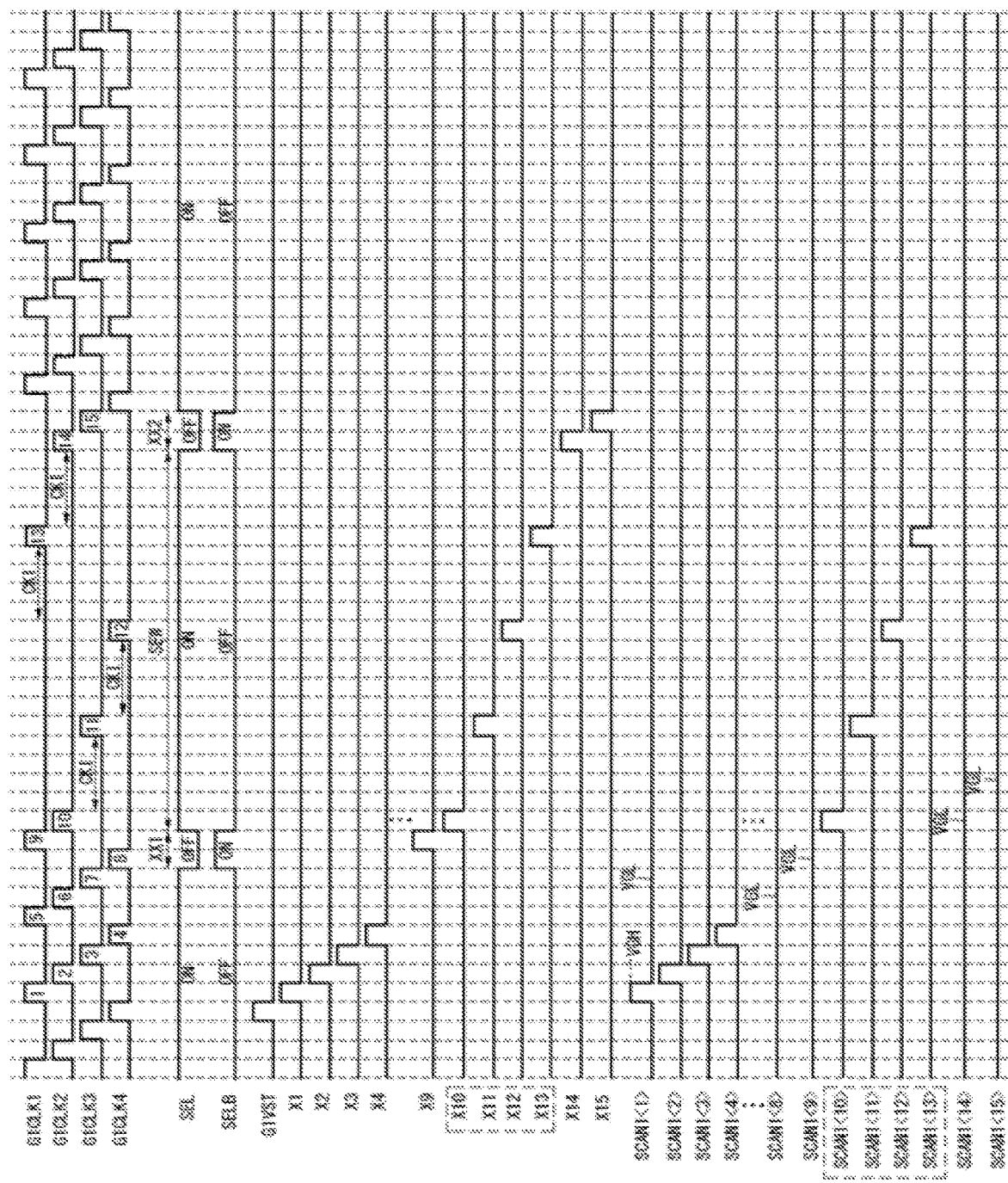
FIG. 19 is another example waveform diagram for explaining a drive of a first gate driver circuit shown in FIG. 17.

FIG. 18 is an example waveform diagram for explaining a drive of the first gate driver circuit shown in FIG. 17. FIG. 19 is another example waveform diagram for explaining a drive of the first gate driver circuit shown in FIG. 17.

Referring to FIGS. 17 to 19, a pulse interval of the first gate shift clock group G1CLK1-G1CLK4 and turn-on and turn-off timings of the first and second selection signals SEL and SELB are determined depending on a position of a preset sensing target display line in a corresponding frame. The timing controller 21 may previously know the position of the sensing target display line in the corresponding frame in accordance with a preset sensing program. The sensing program may be previously embedded in the timing controller 21, or may be input to the timing controller 21 from the host system 40.

The timing controller 21 may adjust the pulse interval of the first gate shift clock group G1CLK1-G1CLK4 and the turn-on and turn-off timings of the first and second selection signals SEL and SELB in accordance with the position of the sensing target display line, thereby controlling a sensing time. When a first gate signal to be input to the sensing target display line is determined as a j-th first gate signal, the timing controller 21 sets a pulse interval CKI between a j-th clock and a (j+1)th clock to be greater than pulse intervals between other adjacent clocks, sets a period from a rising time of the j-th clock to a rising time of the (j+1)th clock as a turn-on period SEW of the first selection signal SEL, and respectively sets turn-off periods XX1 and XX2 of the first selection signal SEL by at least one clock before and after the turn-on period SEW of the first selection signal SEL, so as to secure a sufficient sensing time. Further, the timing controller 21 may set the second selection signal SELB to be opposite in phase to the first selection signal SEL. However, embodiments are not limited thereto. For example, both the first selection signal SEL and the second selection signal SELB may be simultaneously turned off in some period, so as to securely output the first gate signal.

In embodiments disclosed herein, the sensing target display line in the corresponding frame may previously be determined as one display line as shown in FIG. 18, or as a plurality of display lines as shown in FIG. 19. FIG. 19 illustrates that the plurality of sensing target display lines in the corresponding frame is successively disposed, by way of example. However, embodiments are not limited thereto. For example, at least some of the plurality of sensing target display lines in the corresponding frame may be spaced apart from each other. The number of sensing target display lines set to be sensed in one frame and the number of gate shift clocks input through different clock lines are irrelevant to each other.

The timing controller 21 may adjust the pulse interval of the first gate shift clock group G1CLK1-G1CLK4 and the turn-on and turn-off timings of the first and second selection signals SEL and SELB in accordance with the position of the sensing target display line through various methods.

As an example of the various methods, as shown in FIG. 18, when a first gate signal to be input to the sensing target display line is determined as a $10^{th}$ first gate signal SCAN1<10>, the timing controller 21 may set a pulse interval CKI between a tenth clock and an eleventh clock to be greater than pulse intervals between other adjacent clocks so that the sensing drive operation is capable to be performed; set a period from a rising time of the tenth clock to a rising time of the eleventh clock as a turn-on period SEW of the first selection signal SEL; and respectively set turn-off periods XX1 and XX2 of the first selection signal SEL by at least one clock before and after the turn-on period SEW of the first selection signal SEL. Alternatively, the timing controller 21 may set a pulse interval (for example, the pulse interval CKI between the tenth clock and the eleventh clock) between clocks corresponding to a sensing period of the sensing target display line to be greater than pulse intervals between other adjacent clocks based on a turn-on period SEW and turn-off periods XX1 and XX2 of the first selection signal SEL that are previously set to correspond to the sensing period of the sensing target display line.

The timing controller 21 may set the second selection signal SELB to be opposite in phase to the first selection signal SEL. However, embodiments are not limited thereto. For example, both the first selection signal SEL and the second selection signal SELB may be simultaneously turned off in some period, so as to securely output the first gate signal SCAN1<10>.

Referring to FIG. 18, the first gate driver circuit 15A generates the first output signals X1 to X12 in accordance with the first gate shift clock group G1CLK1-G1CLK4. The first output signals X1 to X7, X10 and X12 corresponding to the turn-on period SEW of the first selection signal SEL (i.e., the turn-off period of the second selection signal SELB) are output as first gate signals SCAN1<1> to SCAN1<7>, SCAN1<10>, and SCAN1<12> of the gate high voltage VGH, respectively. In embodiments disclosed herein, the display lines supplied with the $1^{st}$ to $7^{th}$ first gate signals SCAN1<1> to SCAN1<7> of the gate high voltage VGH and the $12^{th}$ first gate signal SCAN1<12> of the gate high voltage VGH are display-driven display lines, and the display line supplied with the $10^{th}$ first gate signal SCAN1<10> of the gate high voltage VGH is a sensing-driven display line.

Further, the output of the first output signals X8, X9 and X11 corresponding to the turn-off periods XX1 and XX2 of the first selection signal SEL (i.e., the turn-on periods of the second selection signal SELB) is cut off Instead, the gate low voltage VGL is output as $8^{th}$, $9^{th}$, and $11^{th}$ first gate signals SCAN1<8>, SCAN1<9>, and SCAN1<11>. The display lines supplied with the $8^{th}$, $9^{th}$, and $11^{th}$ first gate signals SCAN1<8>, SCAN1<9>, and SCAN1<11> of the gate low voltage VGL are pause-driven display lines.

As another example of the various methods, as shown in FIG. 19, when a first gate signal to be input to the sensing target display line is determined as $10^{th}$ to $13^{th}$ first gate signals SCAN1<10> to SCAN1<13>, the timing controller 21 may set all of a pulse interval CKI between a tenth clock and an eleventh clock, a pulse interval CKI between the eleventh clock and a twelfth clock, a pulse interval CKI between the twelfth clock and a thirteenth clock, and a pulse interval CKI between the thirteenth clock and a fourteenth clock to be greater than pulse intervals between other adjacent clocks so that the sensing drive operation is capable to be performed; set a period from a rising time of the tenth clock to a rising time of the fourteenth clock as a turn-on period SEW of the first selection signal SEL; and respectively set turn-off periods XX1 and XX2 of the first selection signal SEL by at least one clock before and after the turn-on period SEW of the first selection signal SEL. Alternatively, the timing controller 21 may set a pulse interval (for example, including the pulse interval CKI between the tenth clock and the eleventh clock, the pulse interval CKI between the eleventh clock and the twelfth clock, the pulse interval CKI between the twelfth clock and the thirteenth clock, and the pulse interval CKI between the thirteenth clock and the fourteenth clock) between clocks corresponding to a sensing period of the sensing target display line to be greater than pulse intervals between other adjacent clocks based on a turn-on period SEW and turn-off periods XX1 and XX2 of the first selection signal SEL that are previously set to correspond to the sensing period of the sensing target display line.

The timing controller 21 may set the second selection signal SELB to be opposite in phase to the first selection signal SEL. However, embodiments are not limited thereto. For example, both the first selection signal SEL and the second selection signal SELB may be simultaneously turned off in some period, so as to securely output the first gate signals SCAN1<10> to SCAN1<13>.

Referring to FIG. 19, the first gate driver circuit 15A generates first output signals X1 to X15 in accordance with the first gate shift clock group G1CLK1-G1CLK4. The first output signals X1 to X7 and X10 to X13 corresponding to the turn-on period SEW of the first selection signal SEL (i.e., the turn-off period of the second selection signal SELB) are output as first gate signals SCAN1<1> to SCAN1<7> and SCAN1<10> to SCAN1<13> of the gate high voltage VGH, respectively. In embodiments disclosed herein, the display lines supplied with the $1^{st}$ to $7^{th}$ first gate signals SCAN1<1> to SCAN1<7> of the gate high voltage VGH are display-driven display lines, and the display lines supplied with the $10^{th}$ to $13^{th}$ first gate signals SCAN1<10> to SCAN1<13> of the gate high voltage VGH are sensing-driven display lines.

Further, the output of the first output signals X8, X9, X14 and X15 corresponding to the turn-off periods XX1 and XX2 of the first selection signal SEL (i.e., the turn-on periods of the second selection signal SELB) is cut off. Instead, the gate low voltage VGL is output as $8^{th}$, $9^{th}$, $14^{th}$ and $15^{th}$ first gate signals SCAN1<8>, SCAN1<9>, SCAN1<14> and SCAN1<15>. The display lines supplied with the $8^{th}$, $9^{th}$, $14^{th}$ and $15^{th}$ first gate signals SCAN1<8>, SCAN1<9>, SCAN1<14> and SCAN1<15> of the gate low voltage VGL are pause-driven display lines.

Figure 20:
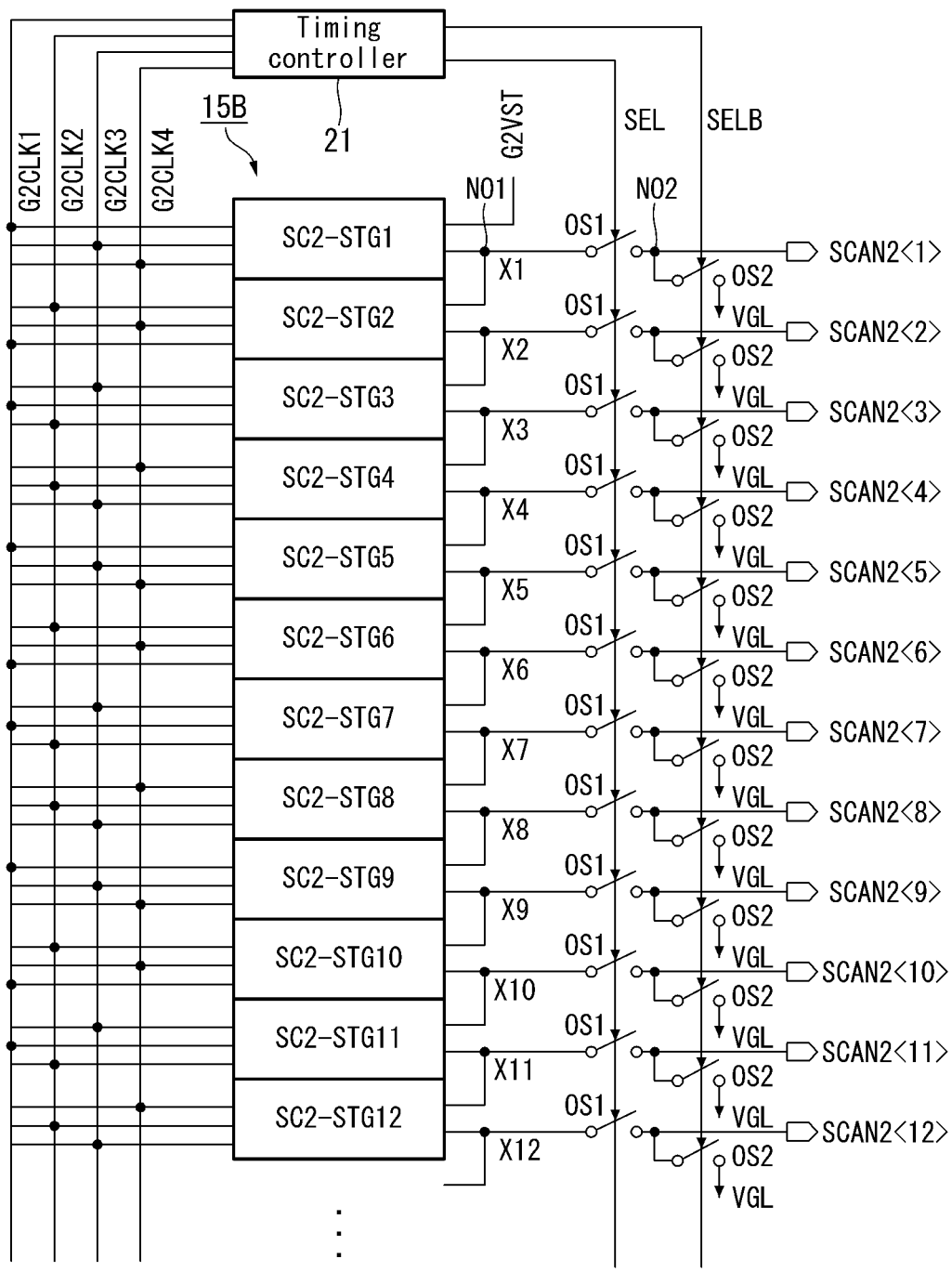
FIG. 20 illustrates configuration of a second gate driver circuit generating a second gate signal.

FIG. 20 illustrates configuration of a second gate driver circuit generating a second gate signal.

Referring to FIG. 20, the second gate driver circuit 15B according to the embodiment includes a plurality of stages SC2-STG1 to SC2-STG12 which is connected to one another in cascade.

The stages SC2-STG1 to SC2-STG12 sequentially shift a second gate start pulse G2Vst in accordance with a second gate shift clock group G2CLK1-G2CLK4 input from the timing controller 21 and generate second output signals X1 to X12. The second gate shift clock group G2CLK1-G2CLK4 may include gate shift clocks of four or more phases, so as to secure a sufficient charging time in a high speed drive.

An operation of the first stage SC2-STG1 of the plurality of stages SC2-STG1 to SC2-STG12 is activated in response to the second gate start pulse G2Vst input from the timing controller 21, and operations of the remaining stages SC2-STG2 to SC2-STG12 are activated in response to the second output signals X1 to X11 of the preceding stages. To this end, a start terminal of the first stage SC2-STG1 is connected to an input line of the second gate start pulse G2Vst. Start terminals of the remaining stages SC2-STG2 to SC2-STG12 are connected to first output nodes NO1 of the preceding stages SC2-STG1 to SC2-STG11. The second output signals X1 to X11 are carry signals for activating the operations of the remaining stages SC2-STG2 to SC2-STG12.

A first output control switch OS1 and a second output control switch OS2 are connected between each of second gate lines supplied with second gate signals SCAN2<1> to SCAN2<12> and each of the stages SC2-STG1 to SC2-STG12.

One terminal of the first output control switch OS1 is connected to a first output node NO1 supplied with the second output signals X1 to X12, and the other terminal of the first output control switch OS1 is connected to the second gate line through a second output node NO2. The first output control switch OS1 is turned on and off in response to a first selection signal SEL input from the timing controller 21. When the first output control switch OS1 is turned on, the first output node NO1 and the second output node NO2 are electrically connected to each other, and the second output signals X1 to X12 supplied to the first output node NO1 are transmitted to the second output node NO2. On the other hand, when the first output control switch OS1 is turned off, the first output node NO1 and the second output node NO2 are electrically disconnected from each other, and the second output signals X1 to X12 supplied to the first output node NO1 are not transmitted to the second output node NO2.

One terminal of the second output control switch OS2 is connected to the second output node NO2, and the other terminal of the second output control switch OS2 is connected to an input terminal of the gate low voltage VGL. The second output control switch OS2 is turned on and off in response to a second selection signal SELB input from the timing controller 21. The second selection signal SELB is opposite in phase to the first selection signal SEL. The second output control switch OS2 is turned off while the first output control switch OS1 is turned on, and is turned on while the first output control switch OS1 is turned off. When the first output control switch OS1 is turned on and the second output control switch OS2 is turned off, the second output signals X1 to X12 of the gate high voltage VGH output from the stages SC2-STG1 to SC2-STG12 are supplied as the second gate signals SCAN2<1> to SCAN2<12> to the second gate lines via the first and second output nodes NO1 and NO2. On the other hand, when the first output control switch OS1 is turned off and the second output control switch OS2 is turned on, the second output signals X1 to X12 output from the stages SC2-STG1 to SC2-STG12 are cut off, and the gate low voltage VGL is supplied as the second gate signals SCAN2<1> to SCAN2<12> to the second gate lines via the second output node NO2.

The first gate lines supplied with the second output signals X1 to X12 of the gate high voltage VGH as the second gate signals SCAN2<1> to SCAN2<12> may be positioned on a display-driven display line or on a sensing-driven display line. On the other hand, the second gate lines supplied with the gate low voltage VGL as the second gate signals SCAN2<1> to SCAN2<12> may be positioned on a pause-driven display line.

Figure 21:
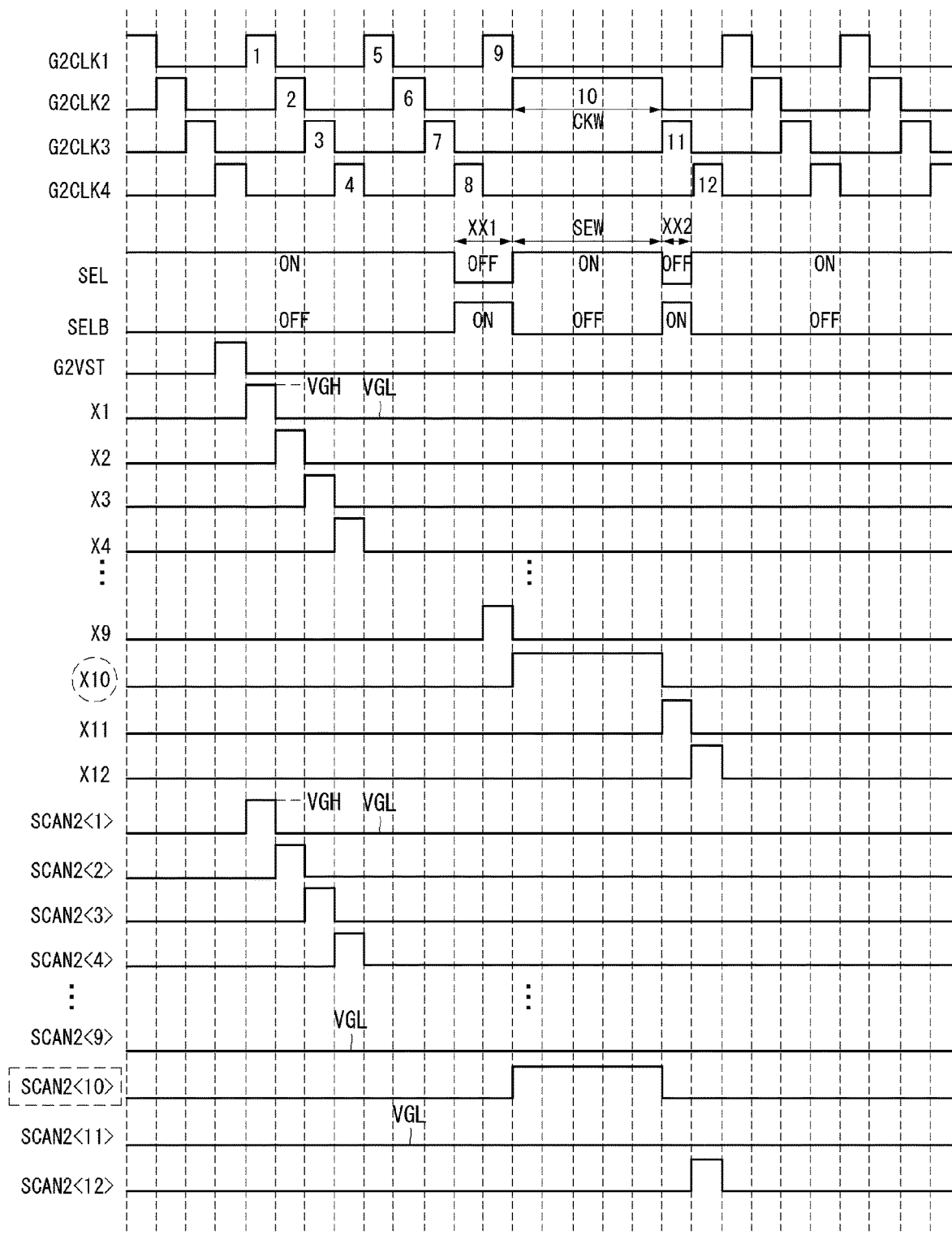
FIG. 21 is an example waveform diagram for explaining a drive of a second gate driver circuit shown in FIG. 20.
Figure 22:
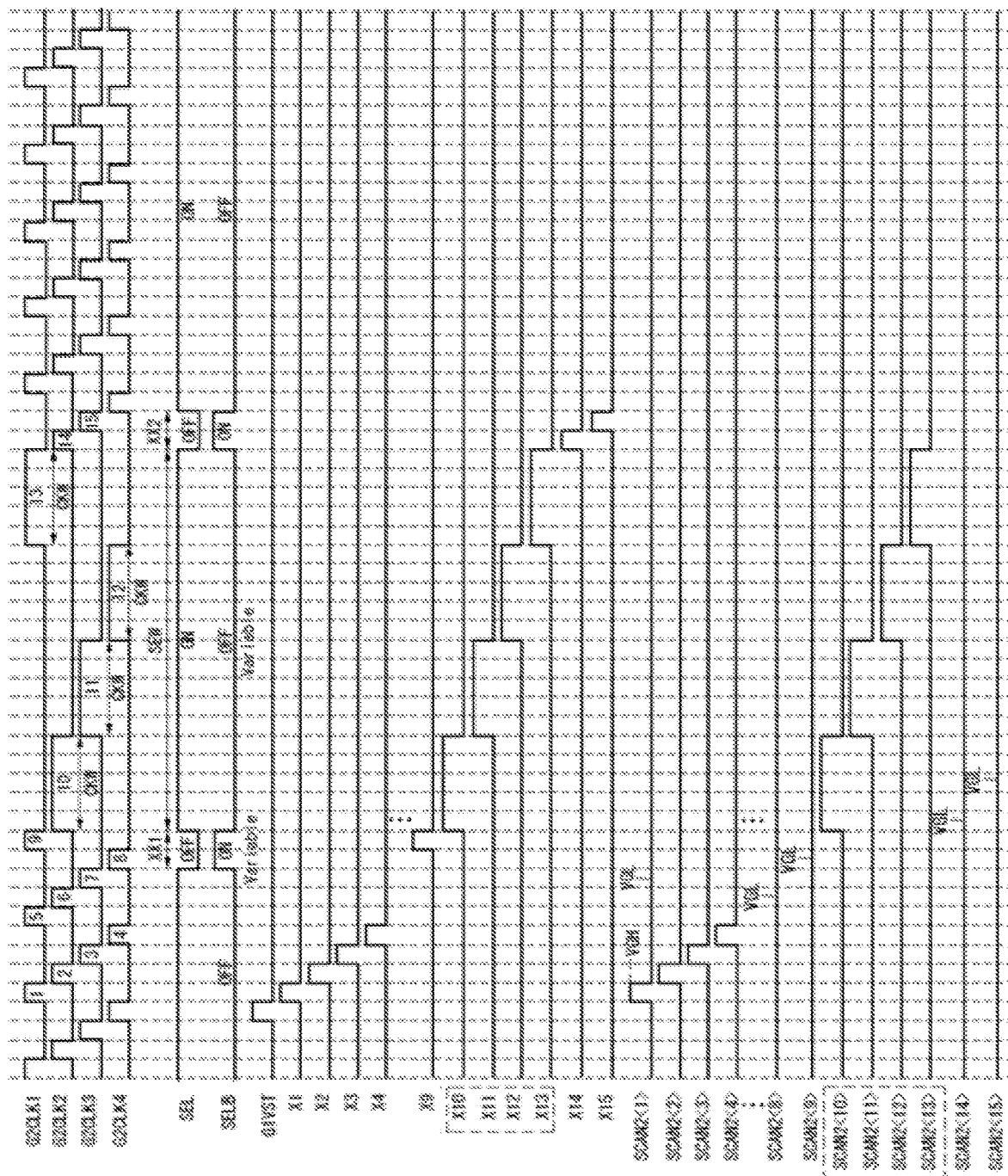
FIG. 22 is another example waveform diagram for explaining a drive of a second gate driver circuit shown in FIG. 20.

FIG. 21 is an example waveform diagram for explaining a drive of the second gate driver circuit shown in FIG. 20. FIG. 22 is another example waveform diagram for explaining a drive of the second gate driver circuit shown in FIG. 20.

Referring to FIGS. 20 to 22, a pulse width of the second gate shift clock group G2CLK1-G2CLK4 and turn-on and turn-off timings of the first and second selection signals SEL and SELB are determined depending on a position of a preset sensing target display line in a corresponding frame. The timing controller 21 may previously know the position of the sensing target display line in the corresponding frame in accordance with a preset sensing program. The sensing program may be previously embedded in the timing controller 21, or may be input to the timing controller 21 from the host system 40. The timing controller 21 may adjust the pulse width of the second gate shift clock group G2CLK1-G2CLK4 and the turn-on and turn-off timings of the first and second selection signals SEL and SELB in accordance with the position of the sensing target display line, thereby controlling a sensing time.

When a second gate signal to be input to the sensing target display line is determined as a j-th second gate signal, the timing controller 21 sets a pulse width CKW of a j-th clock to be greater than pulse widths of other clocks, sets a period from a rising time of the j-th clock to a rising time of a (j+1)th clock as a turn-on period SEW of the first selection signal SEL, and respectively sets turn-off periods XX1 and XX2 of the first selection signal SEL by at least one clock before and after the turn-on period SEW of the first selection signal SEL, so as to secure a sufficient sensing time. Further, the timing controller 21 may set the second selection signal SELB to be opposite in phase to the first selection signal SEL. However, embodiments are not limited thereto. For example, both the first selection signal SEL and the second selection signal SELB may be simultaneously turned off in some period, so as to securely output the second gate signal.

In embodiments disclosed herein, the sensing target display line in the corresponding frame may be previously determined as one display line as shown in FIG. 21, or as a plurality of display lines as shown in FIG. 22. FIG. 22 illustrates that the plurality of sensing target display lines in the corresponding frame is successively disposed, by way of example. However, embodiments are not limited thereto. For example, at least some of the plurality of sensing target display lines in the corresponding frame may be spaced apart from each other. The number of sensing target display lines set to be sensed in one frame and the number of gate shift clocks input through different clock lines are irrelevant to each other.

The timing controller 21 may adjust the pulse width of the second gate shift clock group G2CLK1-G2CLK4 and the turn-on and turn-off timings of the first and second selection signals SEL and SELB in accordance with the position of the sensing target display line through various methods.

As an example of the various methods, as shown in FIG. 21, when a second gate signal to be input to the sensing target display line is determined as a $10^{th}$ second gate signal SCAN2<10>, the timing controller 21 may set a pulse width CKW of a tenth clock to be greater than pulse widths of other clocks so that the sensing drive operation is capable to be performed; set a period from a rising time of the tenth clock to a rising time of an eleventh clock as a turn-on period SEW of the first selection signal SEL; and respectively set turn-off periods XX1 and XX2 of the first selection signal SEL by at least one clock before and after the turn-on period SEW of the first selection signal SEL. Alternatively, the timing controller 21 may set a pulse width (for example, the pulse width CKW of the tenth clock) of a clock corresponding to a sensing period of the sensing target display line to be greater than pulse widths of other clocks based on a turn-on period SEW and turn-off periods XX1 and XX2 of the first selection signal SEL that are previously set to correspond to the sensing period of the sensing target display line.

The timing controller 21 may set the second selection signal SELB to be opposite in phase to the first selection signal SEL. However, embodiments are not limited thereto. For example, both the first selection signal SEL and the second selection signal SELB may be simultaneously turned off in some period, so as to securely output the second gate signal SCAN2<10>.

Referring to FIG. 21, the second gate driver circuit 15B generates the second output signals X1 to X12 in accordance with the second gate shift clock group G2CLK1-G2CLK4. The second output signals X1 to X7, X10 and X12 corresponding to the turn-on period SEW of the first selection signal SEL (i.e., the turn-off period of the second selection signal SELB) are output as second gate signals SCAN2<1> to SCAN2<7>, SCAN2<10>, and SCAN2<12> of the gate high voltage VGH, respectively. In embodiments disclosed herein, the display lines supplied with the $1^{st}$ to $7^{th}$ second gate signals SCAN2<1> to SCAN2<7> of the gate high voltage VGH and the $12^{th}$ second gate signal SCAN2<12> of the gate high voltage VGH are display-driven display lines, and the display line supplied with the $10^{th}$ second gate signal SCAN2<10> of the gate high voltage VGH is a sensing-driven display line.

Further, the output of the second output signals X8, X9 and X11 corresponding to the turn-off periods XX1 and XX2 of the first selection signal SEL (i.e., the turn-on periods of the second selection signal SELB) is cut off. Instead, the gate low voltage VGL is output as $8^{th}$, $9^{th}$, and $11^{th}$ second gate signals SCAN2<8>, SCAN2<9>, and SCAN2<11>. The display lines supplied with the $8^{th}$, $9^{th}$, and $11^{th}$ second gate signals SCAN2<8>, SCAN2<9>, and SCAN2<11> of the gate low voltage VGL are pause-driven display lines.

As another example of the various methods, as shown in FIG. 22, when a second gate signal to be input to the sensing target display line is determined as $10^{th}$ to $13^{th}$ second gate signals SCAN2<10> to SCAN2<13>, the timing controller 21 may set a pulse width CKW of each of tenth to thirteenth clocks to be greater than pulse widths of other clocks so that the sensing drive operation is capable to be performed; set a period from a rising time of the tenth clock to a rising time of a fourteenth clock as a turn-on period SEW of the first selection signal SEL; and respectively set turn-off periods XX1 and XX2 of the first selection signal SEL by at least one clock before and after the turn-on period SEW of the first selection signal SEL. Alternatively, the timing controller 21 may set a pulse width of a clock (for example, including the pulse widths CKW of the tenth to thirteenth clocks) corresponding to a sensing period of the sensing target display line to be greater than pulse widths of other clocks based on a turn-on period SEW and turn-off periods XX1 and XX2 of the first selection signal SEL that are previously set to correspond to the sensing period of the sensing target display line.

The timing controller 21 may set the second selection signal SELB to be opposite in phase to the first selection signal SEL. However, embodiments are not limited thereto. For example, both the first selection signal SEL and the second selection signal SELB may be simultaneously turned off in some period, so as to securely output the second gate signals SCAN2<10> to SCAN2<13>.

Referring to FIG. 22, the second gate driver circuit 15B generates second output signals X1 to X15 in accordance with the second gate shift clock group G2CLK1-G2CLK4. The second output signals X1 to X7 and X10 to X13 corresponding to the turn-on period SEW of the first selection signal SEL (i.e., the turn-off period of the second selection signal SELB) are output as second gate signals SCAN2<1> to SCAN2<7> and SCAN2<10> to SCAN2<13> of the gate high voltage VGH, respectively. In embodiments disclosed herein, the display lines supplied with the $1^{st}$ to $7^{th}$ second gate signals SCAN2<1> to SCAN2<7> of the gate high voltage VGH are display-driven display lines, and the display lines supplied with the $10^{th}$ to $13^{th}$ second gate signals SCAN2<10> to SCAN2<13> of the gate high voltage VGH are sensing-driven display lines.

Further, the output of the second output signals X8, X9, X14 and X15 corresponding to the turn-off periods XX1 and XX2 of the first selection signal SEL (i.e., the turn-on periods of the second selection signal SELB) is cut off Instead, the gate low voltage VGL is output as $8^{th}$, $9^{th}$, $14^{th}$ and $15^{th}$ second gate signals SCAN2<8>, SCAN2<9>, SCAN2<14> and SCAN2<15>. The display lines supplied with the $8^{th}$, $9^{th}$, $14^{th}$ and $15^{th}$ second gate signals SCAN2<8>, SCAN2<9>, SCAN2<14> and SCAN2<15> of the gate low voltage VGL are pause-driven display lines.

As described above, because the embodiments perform a sensing drive operation together with a display drive operation in a vertical active period of each frame, the embodiments can easily perform the sensing drive operation on a desired display line without time constraints.

The embodiments can prevent a sensing target display line from being recognized as a line dim by previously determining a position of the sensing target display line in adjacent frames in a non-sequential manner (or randomly).

The embodiments can easily control a sensing time by adjusting a pulse interval or a pulse width of gate shift clocks in accordance with the position of the sensing target display line.

The embodiments can easily set the number of sensing target display lines by adding the first and second output control switches to an output terminal of the gate driver and controlling turn-on and turn-off operations of the first and second output control switches in response to the first and second selection signals.

The embodiments add the first and second output control switches to the output terminal of the gate driver and control the turn-on and turn-off operations of the first and second output control switches in response to the first and second selection signals to pause-drive some display lines adjacent to the sensing target display line. Hence, the embodiments can reduce the mixing of a noise resulting from the kickback effect and greatly increase the accuracy of the sensing of the sensing target display line.

Although various embodiments have been described with reference to a number of illustrative embodiments thereof, numerous other modifications and embodiments may be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A driving circuit, comprising:
    a timing controller configured to generate a gate shift clock group, a gate start pulse, a first selection signal and a second selection signal; and
    a gate driver configured to generate a gate signal based on at least one of the gate shift clock group, the gate start pulse, the first selection signal and the second selection signal generated by the timing controller and to supply the gate signal to a display panel, the gate driver including:
        a plurality of stages configured to shift the gate start pulse in accordance with clock signals of the gate shift clock group to generate an output signal and supply the output signal to a first output node,
        a first output control switch connected between a second output node connected to a gate line of the display panel and the first output node, the first output control switch being turned on in response to the first selection signal to connect the first output node to the gate line, and
        a second output control switch connected between the second output node and an input terminal of a gate low voltage, the second output control switch being turned on in response to the second selection signal to connect the input terminal of the gate low voltage to the gate line,
    wherein the gate signal includes a sensing gate signal to be applied to a sensing target display line of the display panel and a pause-drive display gate signal for a display line adjacent to the sensing target display line of the sensing gate signal, and
    wherein the first output control switch is turned off in response to the first selection signal and the second output control switch is turned on in response to the second selection signal, and the gate driver outputs the pause-drive display gate signal.

2. The driving circuit of claim 1, wherein the output signal swings between a gate high voltage level capable of turning on switching thin film transistors (TFTs) included in the display panel and a gate low voltage level capable of turning off the switching TFTs of the display panel, and wherein the first output control switch and the second output control switch include a period in which they are turned on and off in reverse.

3. The driving circuit of claim 2, wherein the gate signal further includes a display gate signal to be applied to a display target display line of the display panel.

4. The driving circuit of claim 3, wherein the gate driver outputs the sensing gate signal and the display gate signal in a vertical active period of one frame.

5. The driving circuit of claim 4, wherein the sensing gate signal and the display gate signal are output in different forms.

6. The driving circuit of claim 4, wherein the first output control switch is turned on in response to the first selection signal and the second output control switch is turned off in response to the second selection signal, and the gate driver outputs the sensing gate signal and the display gate signal at the gate high voltage level.

7. The driving circuit of claim 4, wherein the gate driver continuously outputs the pause-drive display gate signal at the gate low voltage level in the vertical active period of the one frame.

8. The driving circuit of claim 7, wherein the gate driver outputs the pause-drive display gate signal at the gate low voltage level.

9. The driving circuit of claim 3, wherein the timing controller sets a pulse interval between clocks synchronized with the sensing gate signal among the gate shift clock group to be greater than a pulse interval between clocks synchronized with the display gate signal among the gate shift clock group.

10. The driving circuit of claim 3, wherein the timing controller sets a pulse width of clocks synchronized with the sensing gate signal among the gate shift clock group to be greater than a pulse width of clocks synchronized with the display gate signal among the gate shift clock group.

11. The driving circuit of claim 3, wherein the plurality of stages includes at least one stage outputting the sensing gate signal, and wherein a position of the at least one stage outputting the sensing gate signal is randomly set in adjacent frames.

12. An electroluminescent display comprising:

a display panel including a first display line for a display drive operation and a second display line for a sensing drive operation, a plurality of pixels displaying an input image being disposed on the first display line, a plurality of pixels, of which electrical characteristics are sensed, being disposed on the second display line;

a timing controller configured to generate a gate shift clock group, a gate start pulse, and first and second selection signals including a period in which phases of the first and second selection signals are opposite to each other; and a gate driver configured to generate a gate signal based on at least one of the gate shift clock group, the gate start pulse, the first selection signal and the second selection signal generated by the timing controller, and to supply the gate signal to the display panel, the gate driver including:

a plurality of stages configured to shift the gate start pulse in accordance with clock signals of the gate shift clock group to generate an output signal and supply the output signal to a first output node, a first output control switch connected between a second output node and the first output node, the first output control switch being turned on in response to the first selection signal to connect the first output node to the second output node, the second output node being connected to one of the first display line or the second display line, and a second output control switch connected between the second output node and an input terminal of a low potential voltage, the second output control switch being turned on in response to the second selection signal to connect the input terminal of the low potential voltage to the second output node, wherein the gate signal includes a sensing gate signal to be applied to the second display line and a pause-drive display gate signal for a first display line adjacent to the second display line, and wherein the first output control switch is turned off in response to the first selection signal and the second output control switch is turned on in response to the second selection signal, and the gate driver outputs the pause-drive display gate signal.

13. The electroluminescent display of claim 12, wherein the gate signal further includes a display gate signal to be applied to the first display line, and wherein the sensing gate signal and the display gate signal are output in a vertical active period of one frame.

14. The electroluminescent display of claim 13, wherein the sensing gate signal and the display gate signal are output signals in different forms.

15. The electroluminescent display of claim 13, wherein while the sensing gate signal synchronized with a sensing data voltage and the display gate signal synchronized with a display data voltage are output, the first output control switch is turned on in response to the first selection signal, and the second output control switch is turned off in response to the second selection signal.

16. The electroluminescent display of claim 13, wherein the pause-drive display gate signal is continuously output at a low potential voltage level capable of turning on switching thin film transistors (TFTs) included in the display panel in the vertical active period of the one frame for a first display line adjacent to the second display line of the sensing operation, wherein the first display line supplied with the pause-drive display gate signal is maintained at an image signal applied in a previous frame, and wherein while the pause-drive display gate signal is output at the low potential voltage level, the first output control switch is turned off in response to the first selection signal, and the second output control switch is turned on in response to the second selection signal.

17. The electroluminescent display of claim 13, wherein a pulse width of clocks synchronized with the sensing gate signal among the gate shift clock group is set to be greater than a pulse width of clocks synchronized with the display gate signal among the gate shift clock group.

18. The electroluminescent display of claim 13, wherein the plurality of stages includes at least one stage outputting the sensing gate signal, and wherein a position of the at least one stage outputting the sensing gate signal is randomly set in adjacent frames.

19. The electroluminescent display of claim 18, wherein a first plurality of second display lines in a corresponding frame are adjacent to one another.

20. The electroluminescent display of claim 19, wherein a second plurality of second display lines are spaced apart from one another.

* * * * *